United States Patent
Lee et al.

(10) Patent No.: US 7,283,401 B2
(45) Date of Patent: Oct. 16, 2007

(54) MONOLITHIC, COMBO NONVOLATILE MEMORY ALLOWING BYTE, PAGE AND BLOCK WRITE WITH NO DISTURB AND DIVIDED-WELL IN THE CELL ARRAY USING A UNIFIED CELL STRUCTURE AND TECHNOLOGY WITH A NEW SCHEME OF DECODER AND LAYOUT

(75) Inventors: Peter W. Lee, Saratoga, CA (US); Fu-Chang Hsu, San Jose, CA (US); Hsing-Ya Tsao, San Jose, CA (US); Han-Rei Ma, Los Altos, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 18 days.

(21) Appl. No.: 11/391,507

(22) Filed: Mar. 28, 2006

(65) Prior Publication Data

US 2007/0047302 A1 Mar. 1, 2007

Related U.S. Application Data

(62) Division of application No. 10/351,180, filed on Jan. 24, 2003, now Pat. No. 7,064,978.

(60) Provisional application No. 60/429,261, filed on Nov. 25, 2002, provisional application No. 60/426,614, filed on Nov. 14, 2002, provisional application No. 60/394,202, filed on Jul. 5, 2002.

(51) Int. Cl.
  *G11C 16/04* (2006.01)
  *G11C 5/06* (2006.01)
  *H01L 29/76* (2006.01)
  *H01L 23/544* (2006.01)

(52) U.S. Cl. ............................ 365/185.29; 365/185.05; 365/63; 365/185.11; 257/340; 257/797

(58) Field of Classification Search ............ 365/185.01, 365/185.05, 185.11, 185.29
See application file for complete search history.

(56) References Cited

U.S. PATENT DOCUMENTS 5,053,841 A 10/1991 Miyakawa et al.

(Continued)

OTHER PUBLICATIONS

"Planarized NVRAM Cell With Self-Aligned BL-BL and WL-BL Isolations", IBM Technical Disclosure Bulletin, IBM Corp. New York, US, vol. 36, No. 2, Feb. 1, 1993 pp. 375-377, XP000354373, ISSN:0018-8684.

(Continued)

*Primary Examiner*—Ly Duy Pham
(74) *Attorney, Agent, or Firm*—Saile Ackerman LLC; Stephen B. Ackerman; Billy Knowles

(57) ABSTRACT

A nonvolatile memory array has a single transistor flash memory cell and a two transistor EEPROM memory cell which maybe integrated on the same substrate. The nonvolatile memory cell has a floating gate with a low coupling coefficient to permit a smaller memory cell. The floating gate placed over a tunneling insulation layer, the floating gate is aligned with edges of the source region and the drain region and having a width defined by a width of the edges of the source the drain. The floating gate and control gate have a relatively small coupling ratio of less than 50% to allow scaling of the nonvolatile memory cells. The nonvolatile memory cells are programmed with channel hot electron programming and erased with Fowler Nordheim tunneling at relatively high voltages.

10 Claims, 20 Drawing Sheets

U.S. PATENT DOCUMENTS

| | | |
|---|---|---|
| 5,153,684 A | 10/1992 | Shoji et al. |
| 5,172,200 A | 12/1992 | Muragishi et al. |
| 5,301,150 A * | 4/1994 | Sullivan et al. ........ 365/185.08 |
| 5,748,538 A | 5/1998 | Lee et al. |
| 5,768,186 A | 6/1998 | Ma |
| 5,898,197 A | 4/1999 | Fujiwara |
| 6,054,348 A | 4/2000 | Lin et al. |
| 6,174,759 B1 | 1/2001 | Verhaar et al. |
| 6,212,102 B1 | 4/2001 | Georgakos et al. |
| 6,266,274 B1 | 7/2001 | Pockrandt et al. |
| 6,307,781 B1 | 10/2001 | Shum |
| 6,326,661 B1 | 12/2001 | Dormans et al. |
| 6,370,081 B1 | 4/2002 | Sakui et al. |
| 6,400,604 B2 | 6/2002 | Noda |
| 6,436,765 B1 | 8/2002 | Liou et al. |
| 6,556,481 B1 | 4/2003 | Hsu et al. |

OTHER PUBLICATIONS

Aritome, et al., "A 0.67/SPl mu/m<2> Self-Aligned Shallow Trench Isolation Cell (SA-STI Cell) for 3.V-only 256 Mbit NAND EEPROMs", ElectronDevices Meeting, 1994, Technical Digest, Int'l San Francisco, CA USA, Dec. 11-14, 1994, New York, NY USA, IEEE Dec. 11, 1994, pp. 61-64, XP010131951, ISBN-0-7803-2111-1.

Shirota et al., "A 2.3 mu M<2> Memory Cell Structure for 16 Mb NAND EEPROMs", IEDM 90, Dec. 9, 1990, pp. 103-106, XP010554684, pp. 103-106, XP010554684.

* cited by examiner

SINGLE TRANSISTOR CELL
(FLASH)

| Operation | Node | Selected cells | Other cells on selected WL | Other cells on selected BL | Any other cells |
|---|---|---|---|---|---|
| Erase | SG | 0.0V | 0.0V | 0.0V | 0.0V |
| | WL | -15v~-22V | (N/A) | (N/A) | 0.0V |
| | BL | 0.0V or float | (N/A) | (N/A) | 0.0V or float |
| | SL | 0.0V or float | (N/A) | (N/A) | 0.0V or float |
| Program | SG | +15.0V~+22.0V | +15.0V~+22.0V | +15.0V~+22.0V | 0.0V |
| | WL | +10.0V~+12.0V | +10.0V~+12.0V | 0.0V | 0.0V |
| | BL | +5.0V | +5.0V | +5.0V | 0.0V |
| | SL | 0.0V | 0.0V | 0.0V | 0.0V |

FIG. 8a

TWO TRANSISTOR CELL
(EEPROM)

| Operation | Node | Selected cells | Other cells on selected WL | Other cells on selected BL | Any other cells |
|---|---|---|---|---|---|
| Erase | SG | 0.0V | 0.0V | 0.0V | 0.0V |
|  | WL | -15v~-22V | 0.0V | 0.0V | 0.0V |
|  | BL | 0.0V or float | 0.0V or float | 0.0V or float | 0.0V or float |
|  | SL | 0.0V or float | 0.0V or float | 0.0V or float | 0.0V or float |
| Program | SG | +15.0V~+22.0V | +15.0V~+22.0V | 0.0V | 0.0V |
|  | WL | +10.0V~+12.0V | +10.0V~+12.0V | 0.0V | 0.0V |
|  | BL | +5.0V | 0.0V | +5.0V | 0.0V |
|  | SL | 0.0V | 0.0V | 0.0V | 0.0V |

FIG. 8b

MONOLITHIC, COMBO NONVOLATILE MEMORY ALLOWING BYTE, PAGE AND BLOCK WRITE WITH NO DISTURB AND DIVIDED-WELL IN THE CELL ARRAY USING A UNIFIED CELL STRUCTURE AND TECHNOLOGY WITH A NEW SCHEME OF DECODER AND LAYOUT

The present invention is a divisional application that claims priority under 35 U.S.C. § 120 from U.S. patent application Ser. No. 10/351,180, filing date Jan. 24, 2003, now U.S. Pat. No. 7,064,978, issued Jun. 20, 2006; which is related to and claims benefit of priority of the filing date of U.S. Provisional Patent Application Ser. No. 60/394,202 filed on Jul. 5, 2002 and entitled "A Novel Monolithic Nonvolatile Memory Allowing Byte, Page and Block Write With No Disturb and Divided-Well in The Cell Array Using A Unified Cell Structure and Technology With A New Scheme of Decoder", which is herein incorporated by reference; and which is further related to and claims benefit of priority of the filing date of U.S. Provisional Patent Application Ser. No. 60/426,614 filed on Nov. 14, 2002, entitled "A Novel Monolithic, Combo Nonvolatile Memory Allowing Byte, Page And Block Write With No Disturb And Divided-Well In The Cell Array Using A Unified Cell Structure And Technology With A New Scheme Of Decoder And Layout", which is herein incorporated by reference; and which is further related to and claims benefit of priority of the filing date of U.S. Provisional Patent Application Ser. No. 60/429,261 filed on Nov. 25, 2002, entitled "A Novel Monolithic, Combo Nonvolatile Memory Allowing Byte, Page And Block Write With No Disturb And Divided-Well In The Cell Array Using A Unified Cell Structure And Technology With A New Scheme Of Decoder And Layout", which is herein incorporated by reference.

RELATED PATENT APPLICATIONS

U.S. patent application Ser. No. 09/852,247 to F. C. Hsu et al filed on May 9, 2001 and assigned to the same assignee as the present invention.

U.S. patent application Ser. No. 09/891,782 to F. C. Hsu et al filed on Jun. 27, 2001 and assigned to the same assignee as the present invention.

BACKGROUND OF THE INVENTION

1. Field of the Invention

This invention relates generally to a non-volatile integrated circuit memory.

More particularly this invention relates to electrically erasable programmable read only memory (EEPROM) and flash electrically erasable programmable read only memory (flash memory).

2. Description of Related Art

The structure and application of the floating gate non-volatile memories is well known in the art. The floating gate nonvolatile memory has three classifications the Electrically Programmable Read Only Memory (EPROM), the Electrically Erasable Programmable Read Only Memory (EEPROM), and the flash Electrically Erasable Programmable Read Only Memory. The EPROM is programmed by electrically forcing charge to the floating gate. Ultra-violet light is employed to eliminate the electrical charges of the programming from the floating gate of the EPROM. The EEPROM and the flash memory are structurally similar at the individual cell, but have different organizations. The EEPROM and the flash memory maybe have the charge transferred to the floating gate for programming by either a channel hot injection of the charge or by Fowler-Nordheim Tunneling through a tunneling oxide. The erasure of the EEPROM and Flash memory is generally by a Fowler-Nordheim Tunneling through the tunneling oxide.

A primary application of a nonvolatile memory is for permanent memory in a microprocessor or microcontroller system. Historically, the permanent program memory for the microprocessor was formed of classic mask programmable read only memory (ROM), and later as EPROM. Modifications to the program memory required physically changing the memory. As the need to update the program of the microprocessor became more important, byte-alterable EEPROM' were developed to provide in-system rewriteability of the memory. Further as the applications for microprocessors and microcontrollers are becoming more pervasive, the need for storage that is permanent and will not fail or disappear when power is removed is required. In most applications, the program is not modified often. However, the data is changed relatively frequently. The program memory can be classified as configuration, traceablity, boot program, or main program. The data includes information from any external input to the system, e.g., application, instrument, recorder, or sensor data that is required for historical purposes or to maintain continuity of operation after power down or power loss. Data memory is typically frequently altered over the lifetime of the application.

The program memory is generally implemented in Flash memory. The Flash memory has memory size per erase that is usually large and is in the units of sector that ranges from 8 KB (64 K-bit) to 64 KB (6512 K-bit). Alternately, the data memory is implemented as EEPROM. The EEPROM used for a data memory must have segments that may be erased as small as single byte (8 bits), to a size of a single page (128-byte), and even to erasure of the whole chip.

The ability of the EEPROM and the Flash memory to be reprogrammed requires the device be able to be altered in system, with minimal hardware or software difficulty. The number of times the device must be altered determines the endurance requirement of the device. Nonvolatility requires the device to retain data without power applied for the lifetime of the application. The lifetime of the application determines the data retention requirement of the device. Both of the reliability requirements of endurance and data retention have associated failure rates, which must be minimized. Since the flash memory is employed as the program memory, it has the least amount of reprogramming and therefore, must have the longest data retention and requires the lowest endurance (approximately 100,000 program/erase cycles). Conversely, the EEPROM, employed as data memory, must be able to be modified repeatedly and therefore must have higher endurance (more than 1 million program erase cycles).

In order to achieve the one million program/erase cycles and have the single-byte erase segment, the traditional EEPROM employs a very large cell size (approximately 100 times the minimum feature size of the technology). Alternately, the flash memory can have a cell size that is significantly smaller (approximately 10 times the minimum feature size of the technology).

In applications requiring high data rate change such as the data memory, as described, the nonvolatile memory requires a faster date change (program/erase) cycle. Thus the EEPROM requires a write or program speed of 1 ms. Alternately, the flash memory can tolerate a write speed that is on the order of 100 ms.

FIGS. 1a-d illustrates a floating gate memory cell of the prior art. The flash memory cell 10 is formed within a p-type substrate 2. An n+ drain region 6 and an n+ source region 4 are formed within the p-type substrate 2.

A relatively thin gate dielectric or tunneling oxide 8 is deposited on the surface of the p-type substrate 2. A poly-crystalline silicon floating gate 12 is formed on the surface of the tunneling oxide 8 above the channel region 5 between the drain region 6 and source region 4. An interpoly dielectric layer 14 is placed on the floating gate 12 to separate the floating gate 8 from a second layer of poly-crystalline silicon that forms a control gate 16.

In most applications of an EEPROM or flash memory, the p-type substrate 2 is connected to a substrate biasing voltage, which in most instances is the ground reference potential (0V). The source region 4 is connected to a source voltage generator through the source line terminal 22. The control gate 16 is connected through the word line terminal 20 to the control gate voltage generator. And the drain region 6 is connected through the contact 24 to the bit line and thus a bit line voltage generator.

The memory cell 10 is separated from adjacent memory cells or circuits of an integrated circuit on a substrate by the shallow trench isolation 26. The shallow trench isolation 26 provides a level isolation from disturbing signals from any operations of the adjacent cells.

As is well known, the coupling ratio of the control gate 16 and floating gate 12 are critical in determining the magnitude of voltage applied across the tunneling oxide 8 to cause the flow of charge to or from the floating gate 12. Thus it is desirable to maintain a relatively large coupling ratio for the floating gate 12. To accomplish this, the floating gate is extended over the shallow trench isolation 26 to form what is commonly termed "wings" 28. The "wings" 28 allow the voltages applied across the control gate 16 to be relatively lower and still allow the charges to flow to and from the floating gate 12. However, the "wings" prevent the design of the memory cell 10 from achieving a minimum size.

According to conventional operation, the memory cell 10 is programmed by applying a relatively high voltage (on the order of 10V) to the control gate 16 through the word line 20. The drain voltage generator VD is set to a moderately high voltage (on the order of 5V), while the source voltage generator VS is set to the ground reference potential (0V). With these voltages hot electrons will be produced in the channel 5 near the drain region 6. These hot electrons will have sufficient energy to be accelerated across the tunneling oxide 8 and trapped on the floating gate 12. The trapped hot electrons will cause the threshold voltage of the field effect transistor (FET) that is formed by the memory cell 10 to be increased by three to five volts. This change in threshold voltage by the trapped hot electrons causes the cell to be programmed from the unprogrammed state of a logical one (1) to a logical zero (0).

Conventionally, the memory cell is erased by setting the word line 20 to a relatively large negative voltage on the order of −18V. The bit line 18 and the source line 22 may be disconnected to allow the drain 6 and the source 4 to float. Alternately, the bit line 18 and the source line 22 are connected such that the drain 6 and the source 4 are connected to the ground reference voltage. Under these conditions there is a large electric field developed across the tunneling oxide 8 in the channel region 5. This field causes the electrons trapped in the floating gate 12 to flow to channel region 5, drain region 6 and source region 4. The electrons are then extracted from the floating gate 12 by the Fowler-Nordheim tunneling. This change in threshold voltage by the removal of the trapped hot electrons causes the cell to be erased (unprogrammed) state If the memory cell is to be written with a logical one (1), the cell is not programmed and no or little negative charges are placed on the floating gate 12. Thus, if the cell is erased, the relatively large negative voltage applied to the control gate 16 through the word line 20 causes the memory cell 10 to become over-erased. Positive charges actually are stored on the floating gate 12. This phenomenon causes the Field Effect Transistor (FET) of the memory cell 10 to become depletion-mode transistor and the drain 6 and the source 4 to become, essentially shorted. When this occurs, the memory cell 10 causes false reading of data from a selected memory cell on a shared bit line of an array having an over-erased memory cell. To overcome this problem, a select gating transistor STx30 is placed between the memory cell 10 and the source line 22, as shown in FIG. 2a-c. This prevents any excess current through the memory cell 10 when the select gating transistor STx30 remains in the off-state.

Refer now FIGS. 2a-2c for further discussion of the two transistor memory cell of the prior art. The memory cell 10 is formed within a p-type well 36 that is formed in an n-type well 34 on a p-type substrate 2. An n+ drain region 4 and an n+ source region 6 are formed within the p-type well 36.

A relatively thin tunneling oxide 8 is deposited on the surface of the p-type substrate 2. A poly-crystalline silicon floating gate 12 is formed on the surface of the tunneling oxide 8 above the channel region 5 between the drain region 6 and source region 4. An interpoly dielectric layer 14 is placed on the floating gate 12 to separate the floating gate 12 from a second layer of poly-crystalline silicon that forms a control gate 16.

The source 4 fundamentally is the drain of the select gating transistor 30. The source 38 of the select gating transistor 30 is formed simultaneously with the drain 6 and the source 4 of the memory cell 10. The gate 40 of the select gating transistor 30 is placed over the gate oxide 39 between the source 4 of the memory cell 10 and the source 38 of the select transistor 30.

When the tunneling oxide 8 is formed, a gate oxide 39 is formed in the channel region between the source 4 of the memory cell 10 and the source 38 of the select transistor 30. The gate 40 is connected to the select control line SG, which conducts a select signal to the select gating transistor 30 to control the impact of the over-erasure of the memory cell.

In most applications, of an EEPROM or flash memory having the two transistor configuration, the p-type well 36 is connected to a substrate biasing voltage, which in most instances is the ground reference potential (0V). The source region 38 of the select gating transistor 30 is connected to a source voltage generator through the source line terminal 22. The control gate 16 is connected through the word line terminal 20 to the control gate voltage generator. The select gating line 32 is connected to a select signal generator to provide the select signal to the gate 40 of the select gating transistor 30. And the drain region 4 is connected through the contact 24 to the bit line 18 to a bit line voltage generator.

The memory cell 10 and select gating transistor are separated from adjacent memory cells or circuits of an integrated circuit on a substrate by the shallow trench isolation 26. The shallow trench isolation 26 provides a level isolation from disturbing signals from any operations of the adjacent cells.

As is well known and described above, the floating gate is extended over the shallow trench isolation 26 to form the "wings" 28. The "wings" 28 allow the voltages applied across the control gate 16 to be relatively lower and still allow the charges to flow to and from the floating gate 12.

However, the "wings" prevent the design of the memory cell 10 from achieving a minimum size.

The memory cell 10 is programmed by setting the drain 6 of the memory cell 10 must be set to a voltage or more than +15.0V. The control gate 16 is set at the ground reference voltage level and the source 4 is made to float by disconnecting the source line to avoid a current leakage. The +15.0V voltage present at the drain 6 and the channel 5 is coupled from bit line 18. The gate 40 through the select gate 32 is set to a ground reference voltage. This causes the high voltage of the drain 6 and the channel 5 causes a Fowler-Nordheim Tunneling of the charges from the floating gate 12 to drain 6.

Conventionally, the memory cell is erased by setting the word line and thus the control gate 16 are biased at around +15.0V-+17.0V. The drain 6 through the bit line 18 and source 4 through the select gating transistor 30 and the source line 22 are both held at the ground reference voltage level. The gate 40 of the select gating transistor 30 is placed at a voltage of from +3.0V-+5V and the bit line 18 is placed at the ground reference voltage to ensure that the drain 4 is set to the ground reference voltage.

Other configurations of the memory cells are known in the art that increase the coupling coefficient through increasing the area at which the control gate and the floating gate are tightly coupled. Other configurations effectively merge the select gating transistor and the memory cell to help improve the cell size. Still other configurations provide more gating transistors that isolate the memory cell from the bit line as well as the source line to prevent disturbances from operations on cells connected to the bit lines and the source lines. Examples of these and other configurations are described hereinafter.

U.S. Pat. No. 6,370,081 (Sakui, et al.) describes a nonvolatile memory cell having a memory cell and two select transistors sandwiching the memory cell. One block of memory nonvolatile memory cells has one control gate line. The nonvolatile memory cells are connected to one control gate line form one page. A sense amplifier having a latch function is connected to a bit line. In a data change operation, data of memory cells of one page are read to the sense amplifiers. After the data is sensed and stored in the sense amplifiers a page erase is performed. The data from the sense amplifiers are programmed in the memory cells of one page. Data in the sense amplifiers maybe changed in the sense amplifiers prior to the reprogramming to allow byte or page data programming.

U.S. Pat. No. 6,400,604 (Noda) teaches a nonvolatile semiconductor memory device having a data reprogram mode. The memory has a memory cell array, a page buffer for storing one page data to be programmed to memory cells, which are selected in accordance with a page address signal. The memory further has an internal column address generating circuit for generating column addresses of the one page with inputting the page address signal in order to transfer the one data stored in the page buffer to the memory cells, a column decoder receiving the column addresses from the internal column address generating circuit, and a control circuit having a data reprogram mode. The data reprogram mode erases one page data stored in the memory cells which are selected in accordance with the page address signal and programs the one page data stored in the page buffer to the memory cells which are selected.

U.S. Pat. No. 6,307,781 (Shum) provides a two transistor cell NOR architecture flash memory. The floating gate transistor is placed between the selection transistor and an associated bit line. The flash memory is deposited within a triple well and operates according to a Fowler-Nordheim tunnel mechanism. Programming of memory cells involves tunneling of carriers through gate oxide from a channel region to a floating gate rather than tunneling from a drain or source region to the floating gate.

U.S. Pat. No. 6,212,102 (Georgakos, et al.) illustrates an EEPROM with two-transistor memory cells with source-side selection. The voltage required to program a memory cell is delivered via a source line.

U.S. Pat. No. 6,266,274 (Pockrandt, et al.) regards a non-volatile two-transistor memory cell which has an N-channel selection transistor and an N-channel memory transistor. The drive circuitry for the cell includes a P-channel transfer transistor. A transfer channel is connected to a row line leading to the memory cell.

U.S. Pat. No. 6,174,759 (Verhaar, et al.) teaches an EEPROM cell that is provided with such a high-voltage transistor as a selection transistor similar to that described in FIGS. 2*a-c*. Apart from the n-well implantation, high-voltage transistors of the p-channel are largely manufactured by means of the same process steps as the p-channel transistors in the logic, so that the number of process steps remains limited.

U.S. Pat. No. 6,326,661 (Dormans, et al.) describes a floating gate memory cell having a large capacitive coupling between the control gate and the floating gate. The control gate is capacitively coupled to the substantially flat surface portion of the floating gate and to at least the side-wall portions of the floating gate facing the source and the drain, and ends above the substantially flat surface portion of the select gate. This provides a semiconductor device having a large capacitive coupling between the control gate and the floating gate of the memory cell thus increasing the coupling ratio.

U.S. Pat. No. 5,748,538 (Lee, et al.), assigned to the same assignee as the present invention, describes an OR-plane memory cell array for flash memory with bit-based write capability. The memory cell array of a flash electrically erasable programmable read only memory (EEPROM) includes nonvolatile memory cells arranged in rows and columns. The sources of nonvolatile memory cells in the same memory block are connected to a main source line through a control gate. Similarly, the drains of the nonvolatile memory cells of the same memory block are connected to a main bit line. The separate source and drains in the column direction are designed for a bit-based write capability. Writing, such as erasing or programming, of a selected nonvolatile memory cell uses the Fowler-Nordheim tunneling method and can be accomplished due to the programming or erase inhibit voltage that is applied to non-selected nonvolatile memory cells.

SUMMARY OF THE INVENTION

An object of this invention is to provide a nonvolatile memory array having a single transistor memory cell for incorporation as a Flash memory and a two transistor memory cell for incorporation as an EEPROM.

Another object of this invention is to provide a one-transistor Flash nonvolatile memory cell having a floating gate with a low coupling coefficient to permit a smaller memory cell.

A further objective of this invention is to provide a two-transistor EEPROM nonvolatile memory cell having a floating gate with a low coupling coefficient connected in series with a small select transistor to permit a smaller memory cell.

Further another object of this invention is to provide a memory array in which the Flash memory and EEPROM memory cells maybe integrated on the same substrate by using the same process technology.

To accomplish at least one of these object and other objects, a nonvolatile memory array is formed on a substrate. The nonvolatile memory array has nonvolatile memory cells arranged in rows and columns. Each nonvolatile memory cell has a source region and a drain region placed within a surface of the substrate. The drain region is placed at a distance from the source region to create a channel region within the substrate. A tunneling insulation layer is placed on the surface in the channel region between the source region and drain region. A floating gate placed over the tunneling insulation layer, the floating gate is aligned with an edge of the source region and an edge of the drain region and having a width defined by a width of the edge of the source and the edge of the drain. A control gate is place over the floating gate and isolated from the floating gate by an interlayer insulator. The floating gate and control gate have a relatively small coupling ratio of less than 50% without rings to allow scaling of the nonvolatile memory cells.

Each column of nonvolatile memory had a bit line in communication with the drain region of all nonvolatile memory cells on the column of nonvolatile memory cells. Similarly, each row of the nonvolatile memory cells has a source line connected to the source region of all nonvolatile memory cells of the row of nonvolatile memory cells. The nonvolatile memory array has a word line connected to the control gate of all nonvolatile memory cells of each row of the nonvolatile memory cells.

In the instance where the nonvolatile memory array has single transistor nonvolatile memory cells, a selected nonvolatile memory cell is programmed to place a charge upon the floating gate of the selected nonvolatile memory cell by first applying a moderately high positive voltage of from approximately +10.0V to approximately +12.0V to the word line connected to the control gate of the selected nonvolatile memory cells. An intermediate positive voltage of approximately 5.0V is applied to the bit line in communication with the drain region of the selected nonvolatile memory cell such that the intermediate positive voltage is transferred to the drain region and a ground reference voltage is applied to the source line connected to the source of the selected nonvolatile memory cell.

The duration of program time for one-transistor Flash cell applying the moderately high positive gate voltage, the intermediate positive drain voltage, and applying the ground reference source voltage is from approximately 1 µs to approximately 100 µs.

A selected memory cell having a single transistor is erased to remove electrical negative charge from the floating gate by the applying a very large negative voltage of from approximately −15V to approximately −22V to the word line connected to the control gate of the selected memory cell.

The source line connected to the source region of the selected memory cell and bit line in communication with the drain region of the selected nonvolatile memory cell is disconnected to allow the source region and the drain region to float. Alternately, a ground reference voltage is applied to the source line connected to the source region of the selected memory cell and bit line in communication with the drain region of the selected nonvolatile memory cell during the erasing of the selected nonvolatile memory cell. The erasing of the nonvolatile memory cell has a duration of from approximately 1 ms to approximately 1 s.

The nonvolatile one-transistor Flash memory array may have nonvolatile memory cells having a gating transistor for divided bitline array architecture. The gating transistor has a source connected to the drain region of the transistor having the floating gate by first metal. The gating transistor also has a drain connected to the global bit line by second metal and a gate connected to a select line to receive select gate signal to selectively apply a bit line voltage signal to the drain region. The nonvolatile memory array further has a gating select lines. Each gating select line is connected to the gate of the gating transistor of each nonvolatile memory cell of one row of nonvolatile memory cells.

Programming to place a charge upon the floating gate of nonvolatile memory cell begins by applying a moderately high positive voltage of from approximately +10.0V to approximately +12.0V to the word line connected to the control gate of the selected nonvolatile memory cells. An intermediate positive voltage of approximately 6.0V is applied to the global bit line connected to the drain region gating transistor of the selected nonvolatile memory cell such that the intermediate positive voltage of 5V is transferred to the drain region of the transistor with the floating gate. A ground reference voltage is applied the source line connected to the source of the transistor with the floating gate of the selected nonvolatile memory cell. A very large positive voltage is applied to the select line connected to the gate of the gating transistor of the selected nonvolatile memory cell.

The duration of applying the very large positive Select-gate voltage, the moderately high positive control-gate voltage, the intermediate positive bitline voltage, and applying the ground reference voltage to program the selected nonvolatile memory cell is from approximately 1 s to approximately 100 µs.

Erasing to remove electrical charge from the floating gate of the selected nonvolatile memory cell begins with applying a very high positive voltage of from approximately +15V to approximately +22V to the word line connected to the control gate of the gating transistor of the selected nonvolatile memory cell. The select signal is set to ground reference voltage and applied to the select line connected to the gate of the gating transistor of the selected nonvolatile memory cell. The source line connected to the source region of the transistor having the floating gate of the selected nonvolatile memory cell and bit line connected to the drain of the gating transistor of the selected nonvolatile memory cell.

Alternately, a ground reference voltage is applied source line connected to the source region of the transistor having the floating gate of the selected nonvolatile memory cell and bit line connected to the drain of the gating transistor of the selected nonvolatile memory cell. The duration of the erasing of the memory cell is of from approximately 1 ms to approximately 1 s.

BRIEF DESCRIPTION OF THE DRAWINGS

FIG. 8a is a table outlining the voltage levels for programming and erasing a flash memory nonvolatile memory cell of this invention.

FIG. 8b is a table outlining the voltage levels for programming and erasing the nonvolatile memory cell of this invention.

DETAILED DESCRIPTION OF THE INVENTION

Figure 1A:
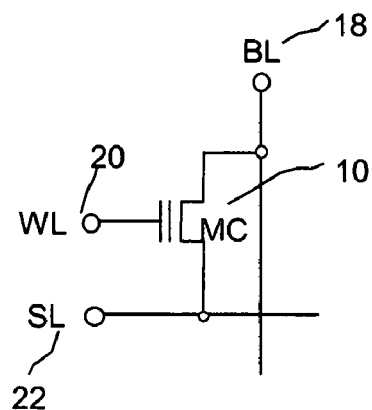
FIGS. 1a-1d are diagrams and cross sectional views of a one transistor nonvolatile floating gate memory cell of the prior art.
Figure 1B:
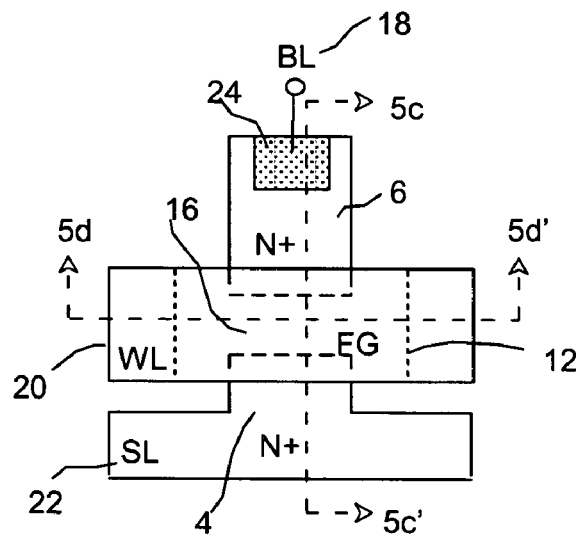
Figure 1C:
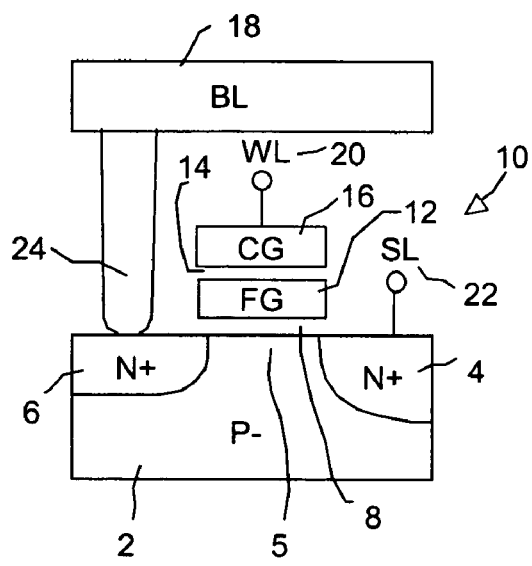

As described above the EEPROM nonvolatile memory is distinguished from the Flash memory in that the byte-alterable feature of the EEPROM is used to store the data code as opposed to the block (page or full chip) alterability of the Flash memory for storing program code. Since EEPROM is used for retaining information that is changed more often such as data, the EEPROM is subjected to more programming and erasing cycles in units of bytes and therefore, the EEPROM must have a higher endurance. In order to achieve high endurance of 1 million cycles, high-voltage bitline (program) and wordline (erase) disturbs to the non-selected bytes have to be eliminated during repeat program and erase operations. This has led to a two transistor EEPROM nonvolatile memory cell that is large and non-scalable but offers no bitline program disturb. In addition, the wordline of EEPROM cell array has been traditionally divided to avoid wordline erase disturb to the unselected bytes. Alternately, the Flash memory is a single transistor nonvolatile memory cell having a smaller cell but requiring longer program and erase time in unit of block. To reduce the cell size of the cell and provide for a unified flash memory and EEPROM design, the present invention provides a transistor within the nonvolatile memory cell that has a floating gate that is placed between and aligned with the edges of the source region and drain region with no overlap. Further, the "wings" as shown in FIGS. 1a-1d and 2a-2c are eliminated to decrease the coupling coefficient of the control gate and the floating gate. The decreased coupling coefficient requires a higher control gate voltage to maintain the same efficiency of the program and erase operations.

FIGS. 3a-d illustrate a one-transistor floating gate flash memory cell of this invention. The nonvolatile memory cell 100 is formed within a p-type substrate 102. An n$^+$ drain region 104 and an n$^+$ source region 106 is formed within the p-type substrate 102.

A relatively thin gate dielectric or tunneling oxide 108 is deposited on the surface of the p-type substrate 102. A poly-crystalline silicon floating gate 112 is formed on the surface of the tunneling oxide 108 above the channel region 105 between the drain region 104 and source region 106. An interpoly dielectric layer 114 is placed on the floating gate 112 to separate the floating gate 112 from a second layer of poly-crystalline silicon that forms a control gate 116.

Figure 1D:
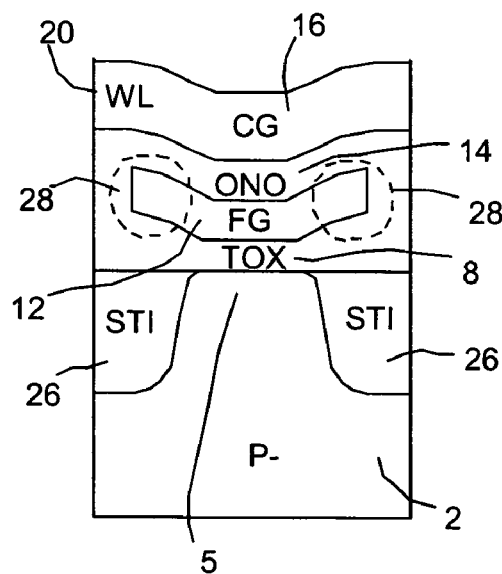
Figure 2A:
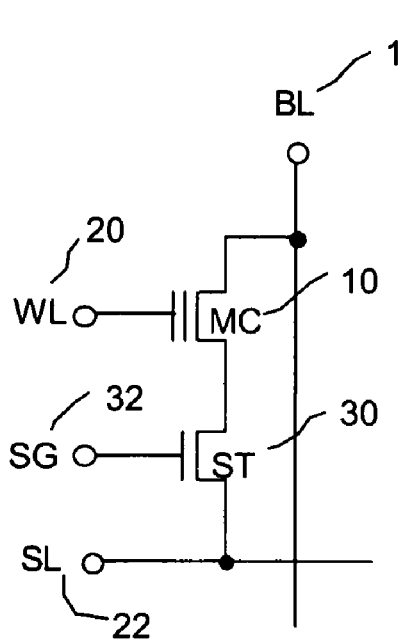
FIGS. 2a-2c are diagrams and cross sectional views of a two transistor nonvolatile floating gate memory cell of the prior art.
Figure 2B:
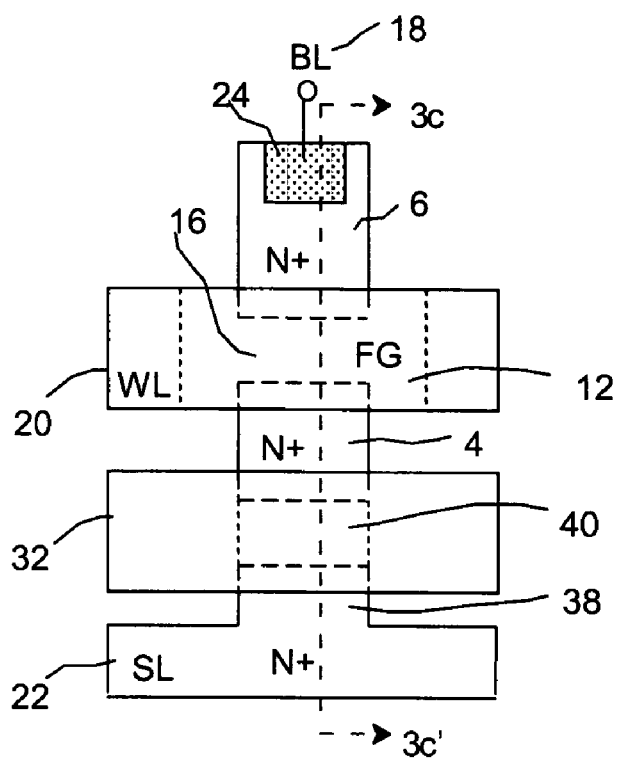
Figure 2C:
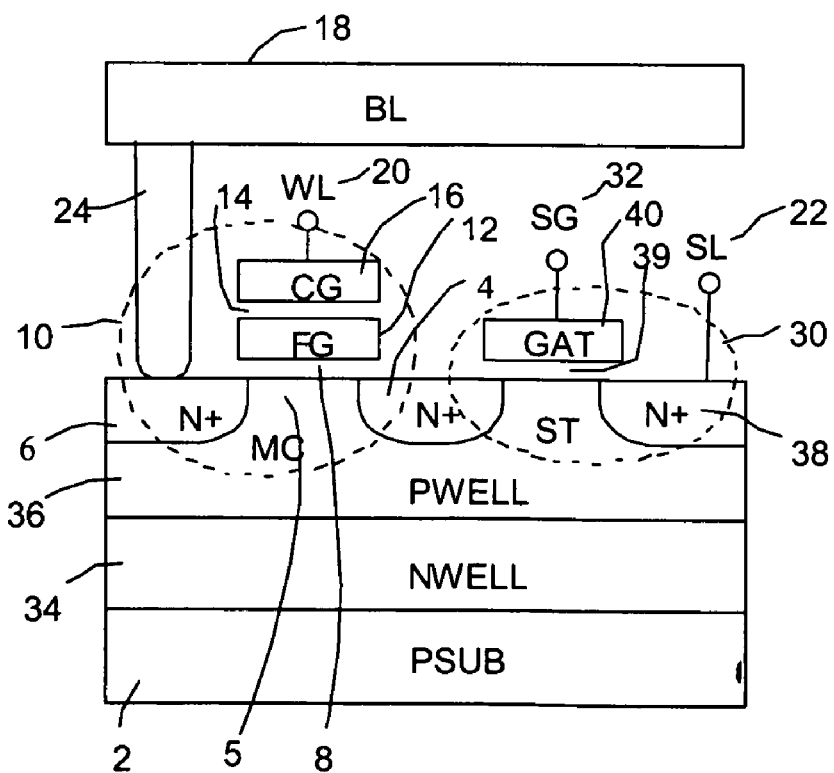

The floating gate 112 is constrained to be aligned with the edges 110 of the drain 104 and the source 106 over the channel region 105. Further, there are no "wings" 28 as shown in FIG. 1d and the floating gate is constrained to the width of the 128 of the drain 104 and the source 106. The coupling coefficient is thus less (<50%) than the nonvolatile memory cell of FIGS. 1a-1d.

In an application, of a single transistor nonvolatile memory cell of this invention within a flash memory, the p-type substrate 102 is connected to a substrate biasing voltage, which in most instances is the ground reference potential (0V). The source region 106 is connected to a source voltage generator through the source line terminal SL 122. The control gate 116 is connected through the word line terminal WL 120 to a control gate voltage generator. And the drain region 104 is connected through the contact 124 to the bit line 118 to a bit line voltage generator.

The memory cell 100 is separated from adjacent memory cells or circuits of an integrated circuit on a substrate by the shallow trench isolation 126. The shallow trench isolation 126 provides a level isolation from disturbing signals from any operations of the adjacent cells.

To compensate for the lower the coupling ratio of the control gate 116 and floating gate 112, the magnitude of voltage applied to control gate has to be increased to maintain the same tunneling electrical field across the same thickness of tunneling oxide 108 to cause the flow of charge to or from the floating gate 112. In the single transistor flash nonvolatile memory cell of this invention, the voltage for the programming and erasure are now only few volts larger than those of the prior art using EPROM with Tunnel Oxide (ETOX) flash technology. ETOX being a registered trademark of Intel Corporation.

According to the operation of the nonvolatile memory cell of this invention as shown in FIG. 8a, the memory cell 100 is programmed by applying a relatively high voltage (on the order of +10.0V-+12.0V) to the control gate 116 through the word line WL 120. The drain voltage generator is set to a moderately high voltage (on the order of 5V) to set the bit line BL 118 and thus the drain 104 to the moderately high voltage, while the source voltage generator is set to the ground reference potential (0V) to set the source line SL 122 and the thus the source 106 to the ground reference potential. With these voltages hot electrons will be produced in the channel 105 near the drain region 104. These hot electrons will have sufficient energy to be accelerated across the tunneling oxide 108 and trapped on the floating gate 112. The trapped hot electrons will cause the threshold voltage of the field effect transistor (FET) that is formed by the memory cell 100 to be increased by three to five volts. This change in threshold voltage by the trapped hot electrons causes the cell to be programmed from the unprogrammed state of a logical one (1) to a logical zero (0).

The single transistor flash memory cell of this invention is erased by setting word line generator and thus control gate 116 through the word line WL 120 to a relatively large negative voltage of from −15.0–−22.0V, preferably −18.0V. The bit line voltage generator and thus the bit line BL 118 and the source line generator and thus the source SL 122 maybe disconnected to allow the drain 104 and the source 106 to float. Alternately, the bit line voltage generator and thus the bit line BL 118 and the source line generator and thus the source SL 122 is connected such that the drain 104 and the source 106 are connected to the ground reference voltage. Under these conditions there is a large electric field developed across the tunneling oxide 108 in the channel region 105. This field causes the electrons trapped in the floating gate 112 to flow to channel region 105 by the Fowler-Nordheim tunneling.

Figure 3A:
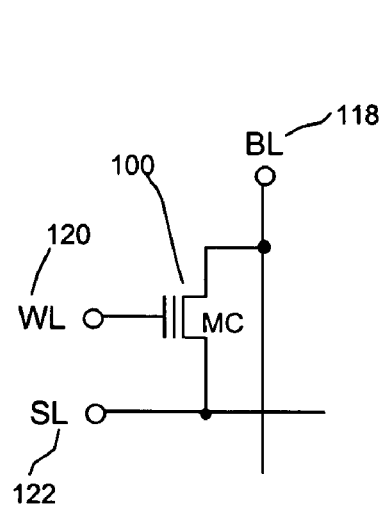
FIGS. 3a-3d are diagrams and cross sectional views of a one transistor nonvolatile floating gate memory cell of this invention.
Figure 3B:
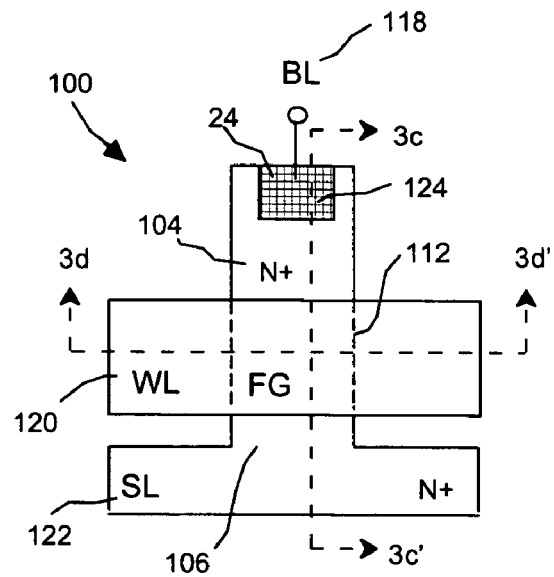
Figure 3C:
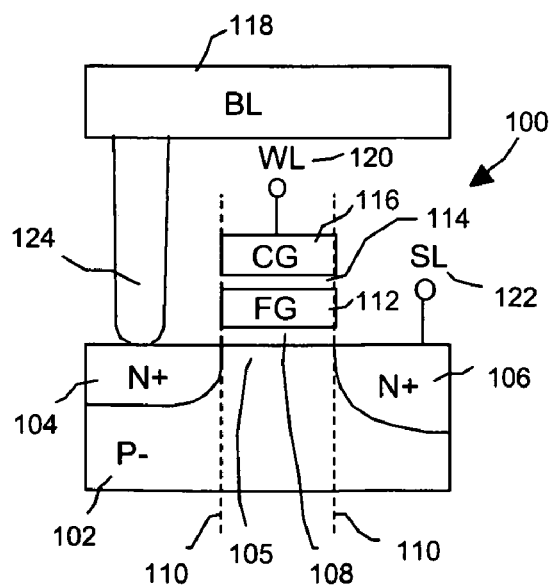
Figure 3D:
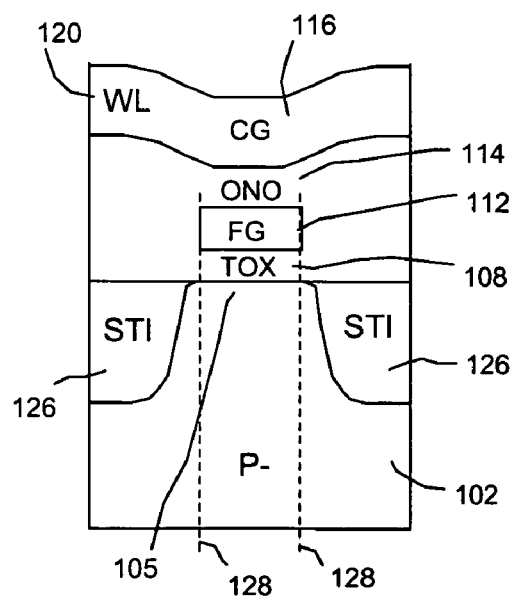
Figure 4:
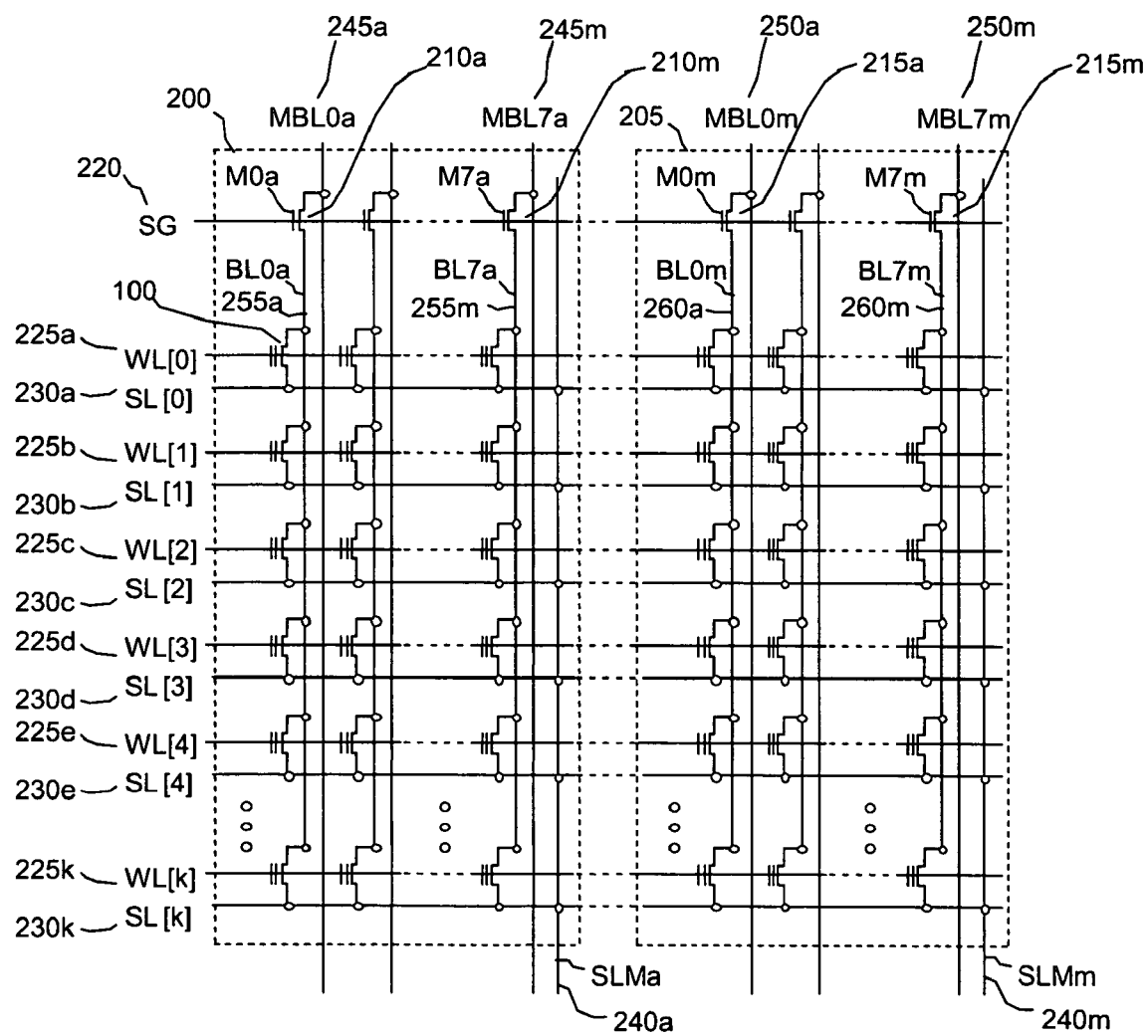
FIG. 4 is schematic diagram of an array of one transistor nonvolatile memory cells of this invention.

FIG. 4 illustrates an application of a single transistor flash nonvolatile memory cell of FIGS. 3a-3d in a block of flash memory array. Groups of single transistor nonvolatile memory cells 100 are arranged in rows and columns. In the flash memory, the memory cells may be a single group having the common p-type substrate as shown in FIGS. 3a-3d. However, the structure maybe organized as in what is commonly referred to as a triple-well structure, in which a large n-type well is formed on the p-type substrate and smaller p-type wells are placed within the n-type well. Then relatively large blocks or subarrays 200 and 205 of the nonvolatile memory cells 100 are formed within the separate p-type wells. The control gate of each nonvolatile memory cell 100 of each row of the array is connected to one word line 225a, . . . , 225k. Similarly, the source of each nonvolatile memory cell 100 of each row of the array is connected to one source line 230a, . . . , 230k. The drain of each nonvolatile memory cell 100 of each column of the array is connected to one bit line of first metal 255a, . . . , 255m, 260a, . . . , 260m.

The subarrays may in fact have vertical subarrays (not shown). To further segment the array and control of the array, the individual bit lines 255a, . . . , 255m, 260a, . . . , 260m are connected to master bit lines 245a, . . . , 245m, 250a, . . . , 250m through the gating transistors 210a, . . . , 210m, 215a, . . . , 215m. The drain of the gating transistors 210a, . . . , 210m, 215a, . . . , 215m of each column of the array is connected to one of the master bit lines of second metals 245a, . . . , 245m, 250a, . . . , 250m. The source of each of the gating transistors 210a, . . . , 210m, 215a, . . . , 215m is connected to drains of each nonvolatile memory cell 100 on a column of the array. The gates of the gating transistors 210a, . . . , 210m, 215a, . . . , 215m for a block 200 or 205 or for multiple blocks 200 and 205 the select gating line SG 220. The source lines 230a, . . . , 230k for each block 200 and 205 are connected respectively to the master source lines 240a and 240m respectively.

Referring back to FIG. 8a, the programming of selected cells is as described for an individual cell. The word line 225a, . . . , 225k containing the cells to be programmed (multiple cells per word line may be programmed) is activated to the relatively high voltage (on the order of +10.0V-+12.0V). The gate line SG 220 and thus the gate of the gating transistors 210a, . . . , 210m, 215a, . . . , 215m are set to very high voltage (on the order of +18.0V-+22.0V) to activate the gating transistors 210a, . . . , 210m, 215a, . . . , 215m as opposed to only about 10V used in prior art. With this very high voltage on the gate line SG 220, the transistors of 210a, . . . , 210m, 215a, . . . , 215m can be made much smaller than the similar devices in prior art to save silicon area. The master bit lines of second metal of 245a, . . . , 245m, 250a, . . . , 250m of the column containing the selected nonvolatile memory cells 100 is set to a moderately high voltage (on the order of 5V). The master source lines 240a, . . . , 240m is set to the ground reference voltage (0V). As described above this causes a channel hot electron charging of the floating gate of the selected nonvolatile memory cells 100.

The master bit lines 245a, . . . , 245m, 250a, . . . , 250m not containing the selected nonvolatile memory cells that are not programmed (these cells are set to a logical one (1) by the erasure) are set to the ground reference potential. The gate line 220 SG is set to the very high voltage to activate the gating transistors 210a, . . . , 210m, 215a, . . . , 215m for even those bit lines 255a, . . . , 255m, 260a, . . . , 260m not containing the selected nonvolatile memory cells during program operation. Thus the drain of the nonselected memory cells not on the bit lines 255a, . . . , 255m, 260a, . . . , 260m not containing the selected nonvolatile memory cells are set to the ground reference potential (0V).

The nonselected nonvolatile memory cells on the word line 225a, . . . , 225k containing the selected nonvolatile memory cells have their control gates set to the relatively high voltage (+10.0V-+12.0V) during program operation. The source of each of the nonvolatile memory cells of the block either selected or nonselected are set to the ground reference potential (0V).

The nonselected nonvolatile memory bit on the bit line 255a, . . . , 255m, 260a, . . . , 260m containing the selected nonvolatile have their drains set to the relatively high voltage of approximately +5.0V. Since the drains and the source of the transistor having the floating gate are set to the ground reference potential (0V), the channel hot electron phenomena is prevented from occurring and thus disturbing the nonselected nonvolatile memory cells.

Those nonvolatile memory cells not in the same block or subarray of nonvolatile memory cells being selected have their gate line 220, word lines 225a, . . . , 225k, bit lines 255a, . . . , 255m, 260a, . . . , 260m, and source lines 230a, . . . , 230k set to the ground reference potential (0V) to prevent any disturbing signals within the subarrays.

The erasure occurs for an entire block or subarray and is essentially as described for an individual cell. All the word lines 225a, . . . , 225k within the subarray are set to the very large negative voltage (on the order of −18.0V-22.0V). The gate line 220 SG and thus the gate of the gating transistors 210a, . . . , 210m, 215a, . . . , 215m are set to the ground reference potential (0V) to deactivate the gating transistors 210a, . . . , 210m, 215a, . . . , 215m. The master bit lines 245a, . . . , 245m, 250a, . . . , 250m of the subarray are set to the ground reference voltage (0V). The master source lines 240a, . . . , 240m and thus the source lines 230a, . . . , 230k of the subarray are set to the ground reference voltage (0V). As described above this causes a Fowler-Nordheim tunneling of charges from the floating gate to remove all charge from the floating gates of the nonvolatile memory cells 100 of the subarray 200 and 205.

Since all the nonvolatile memory cells 100 of the subarray 200 and 205 10 are to be erased there are no nonselected nonvolatile memory cells within the subarray 200 and 205. Those nonvolatile memory cells not in the same block or subarray of nonvolatile memory cells being selected have their gate line 220, word lines 225a, . . . , 225k, bit lines 255a, . . . , 255m, 260a, . . . , 260m, and bit lines 255a, . . . , 255m, 260a, . . . , 260m set to the ground reference potential (0V) to prevent any disturbing signals within the subarrays.

Figure 5A:
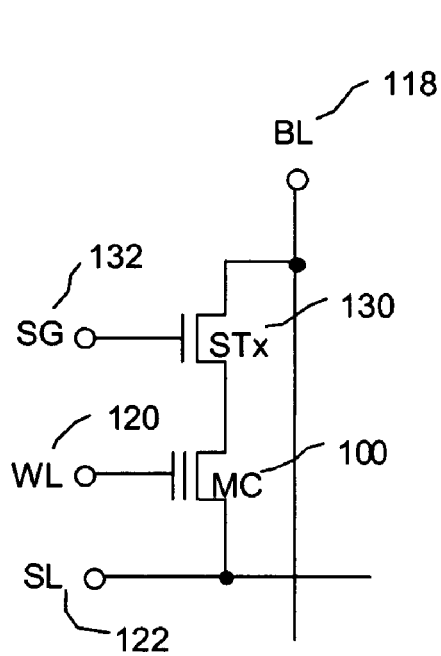
FIGS. 5a-5c are diagrams and cross sectional views of a two transistor nonvolatile floating gate memory cell of this invention.
Figure 5B:
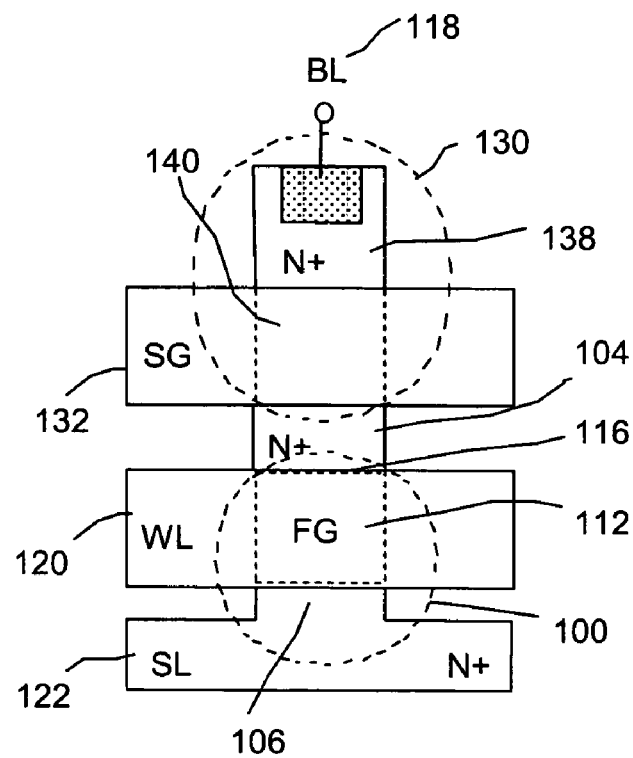
Figure 5C:
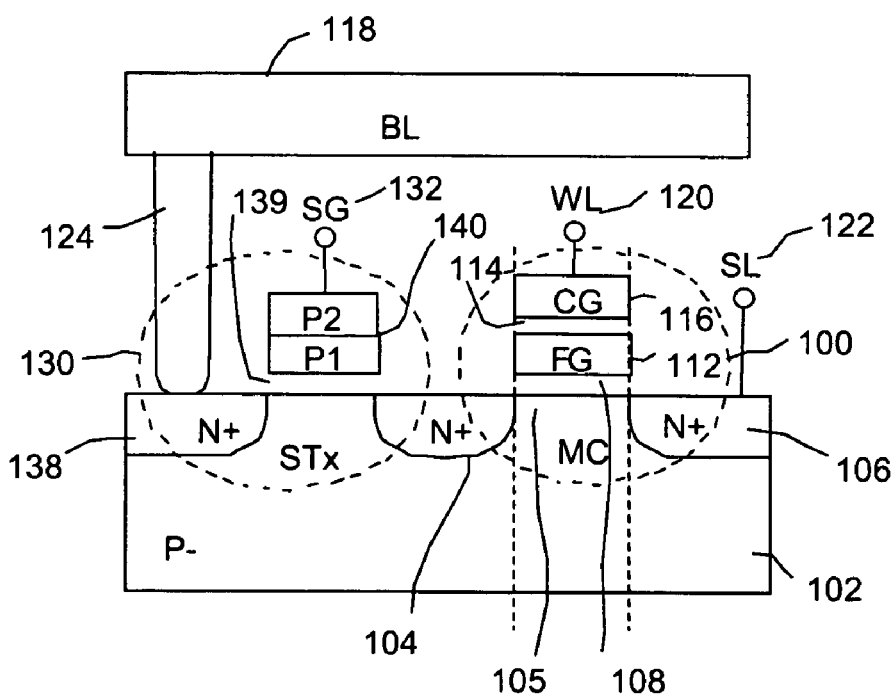

In applications having smaller increments of erasure and requiring more endurance (ability to withstand a high number of program and erase cycles) such as those for which the EEPROM is most applicable, the two transistor cell is most suited to prevent the nonvolatile memory cells from being over-erased. Refer to FIGS. 5*a*-5*c* for a description of the two transistor memory cell of this invention. The memory cell 100 is formed on a p-type substrate 102. An n$^+$ drain region 104 and an n$^+$ source region 106 is formed within the p-type substrate 102.

A relatively thin tunneling oxide 108 is deposited on the surface of the p-type substrate 102. A poly-crystalline silicon floating gate 112 is formed on the surface of the tunneling oxide 108 above the channel region 105 between the drain region 104 and source region 106. An interpoly dielectric layer 114 is placed on the floating gate 112 to separate the floating gate 112 from a second layer of poly-crystalline silicon that forms a control gate 116.

The drain 104 fundamentally is the source of the select gating transistor 130. The drain 138 of the select gating transistor 130 is through the contact 124 to the bit line 118. The gate 140 of the select gating transistor 130 is placed over the gate oxide 139 between the source 108 of the memory cell 100 and the source 138 of the select transistor 130. The oxide 139 of gating device is thicker than tunnel oxide 108 of floating-gate device 100 to withstand +18V on gating devices' gates during program operation.

When the tunneling oxide 108 is formed, a thicker gate oxide 139 is formed in the channel region between the drain 104 of the memory cell 100 and the drain 138 of the select transistor 130. The gate 140 is connected to the select control line 132, which conducts a select signal to the select gating transistor 130 to control the impact of the over-erasure of the memory cell.

In most application of an EEPROM or flash memory having the two transistor configuration, the p-type substrate 102 is connected to a substrate biasing voltage, which in most instances is the ground reference potential (0V). The drain region 138 of the select gating transistor 130 is connected to a bit line voltage generator 6V through the contact 124 and the bit line terminal 118. The control gate 116 is connected through the word line terminal 120 to the control gate voltage generator. The select gating line 132 is connected to a select signal generator to provide the select signal to the gate 140 of the select gating transistor 130. And the source region 106 is connected to the source line 122 to a source line voltage generator.

As is well known and further described above, the floating gate is extended over the shallow trench isolation 126 to form the "wings" 128. The "wings" 128 allow the voltages applied across the floating gate 112 to be relatively lower and still allow the charges to flow to and from the floating gate 112. However, the "wings" prevent the design of the memory cell 100 from achieving a minimum size.

Similar to the one transistor nonvolatile memory cell of FIGS. 3*a*-3*d*, the floating gate 112 is constrained to be aligned with the edges 110 of the drain 104 and the source 106 over the channel region 105. Further, there are no "wings" 28 as shown in FIG. 1*d* and the floating gate is constrained to the width of the 128 of the drain 104 and the source 106. The coupling coefficient is thus less (<50%) than the nonvolatile memory cell of FIGS. 2*a*-2*c*.

The memory cell 100 is programmed as shown in FIG. 8*b* by setting the voltage at the drain 104 of the memory cell 100 to a voltage of approximately +5.0V. The control gate 116 is set at a relatively high positive voltage level (approximately +10.0V-approximately +12.0V) and the source 104 is grounded. The +5.0V voltage present at the drain 104 and the channel 105 is coupled from bit line 118 via the select gating transistor 130. The gate 140 through the select gate 132 SG is set to a voltage of from approximately +17.0V-+22V. This causes the high voltage of the drain 104 and the channel 105 causes a Channel-Hot-Electron (CHE) programming to inject electrons into floating gate 112 from drain 106.

This two transistor EEPROM memory cell structure of this invention is a scalable structure since the select gating transistor 130 requires approximately +6.0V at the bit line 118 and 5V at drain 104 of cell during CHE program operation. As a consequence, there is only about one volt drop across Vds of the gating device 130. Such a low drain to source voltage (Vds) requirement in gating device 130 and low voltage 6V in bit line 18 does not force a higher junction breakdown and larger channel length in the select gating transistor 130, As a result, a small gating device 130 can be achieved within same pitch of flash cell 100 in width which is now suitable for technology below 0.13 µm.

The memory cell is erased by setting the word line and thus the control gate 116 is biased at from −15.0V--22.0V. The drain 104 through the select gating transistor 130 and source 104 through the source line 122 are both held at the ground reference voltage level. The gate 140 of the select gating transistor 130 is placed at a voltage of from +3V and the bit line 118 is placed at the ground reference voltage to ensure that the drain 6 is set to the ground reference voltage. Alternately, the bit line 118 and the source line 122 maybe forced to be floating.

Figure 6:
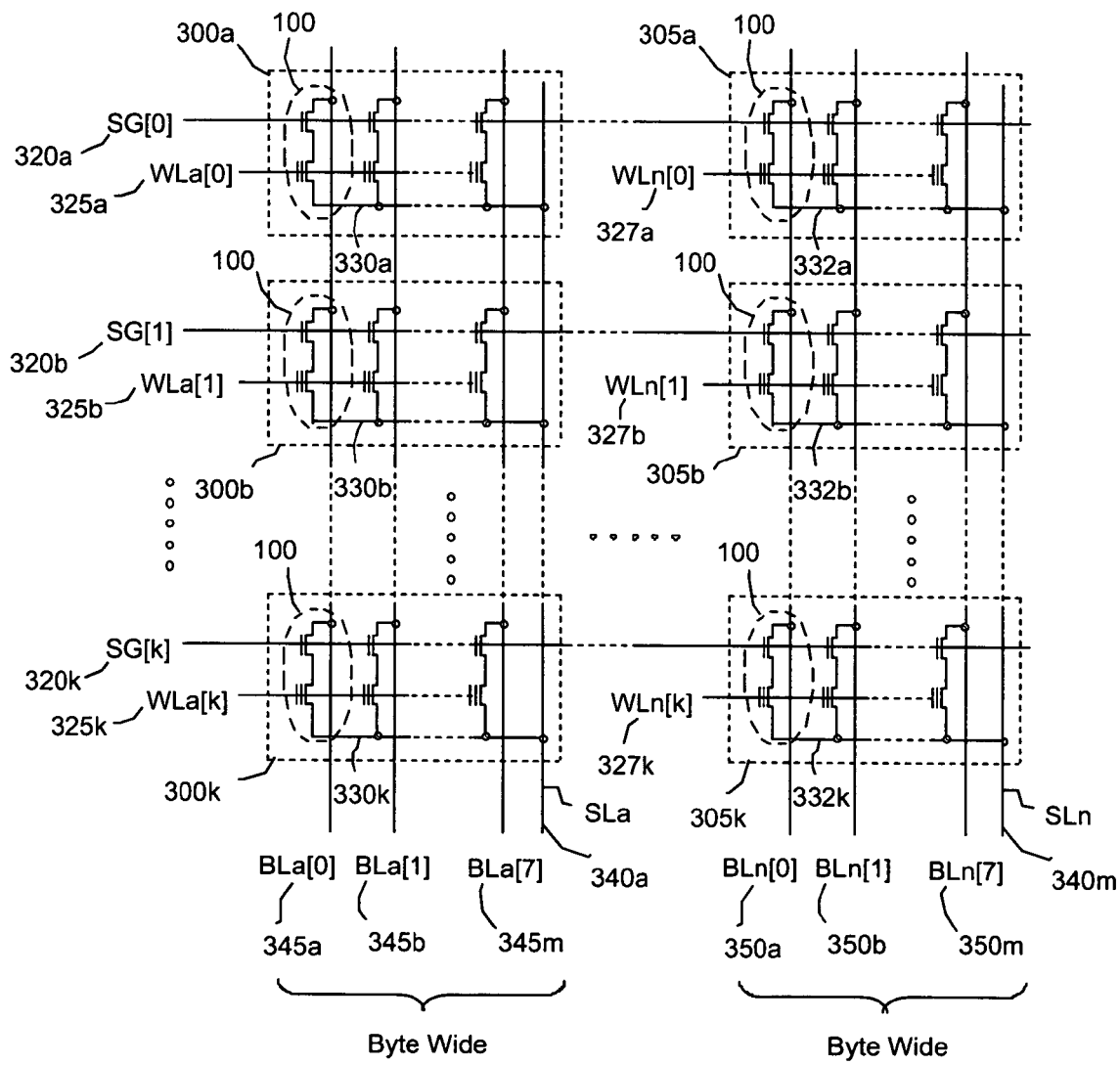
FIG. 6 is a schematic diagram of an array of two transistor nonvolatile memory cells of this invention.

FIG. 6 illustrates an application of a two transistor nonvolatile memory cell of FIGS. 5*a*-5*d* in an EEPROM array. Groups of single transistor nonvolatile memory cells 100 are arranged in units of cells 300*a*, . . . , 300*k*, 305*a*, . . . , 305*k*. These units generally are a byte, but are arranged in rows and columns. In the flash memory, the memory cells may be a single group having the common p-type substrate as shown in FIGS. 3*a*-3*d*. The units of cells 300*a*, . . . , 300*k*, 305*a*, . . . , 305*k* are constructed in the preferred embodiment is formed in the P-substrate without any triple well The control gate of each nonvolatile memory cell 100 of each row of the array is connected to one word line 325*a*, . . . , 325*k*, 327*a*, . . . , 327*k*. Similarly, the source of each nonvolatile memory cell 100 of each row of the array is connected to one source line 330*a*, . . . , 330*k*, 332*a*, . . . , 332*k*. The drain of each nonvolatile memory cell 100 of each column of the array is connected to one bit line 345*a*, . . . , 345*m*, 350*a*, . . . , 350*m*.

Each nonvolatile memory cell 100 of each unit 300*a*, . . . , 300*k*, 305*a*, . . . , 305*k* are connected to master bit lines 345*a*, . . . , 345*m*, 350*a*, . . . , 350*m* through the gating transistors of the memory cells 100 by the drain of the gating transistors. The gates of the gating transistors for each memory cell of the units 300*a*, . . . , 300*k*, 305*a*, . . . , 305*k* on each row are connected to the select gating lines 320*a*, . . . , 320*k*. The source lines 330*a*, . . . , 330*k*, 332*a*, . . . , 332*k* for each unit 300*a*, . . . , 300*k*, 305*a*, . . . , 305*k* are connected respectively to the master source lines 340*a* and 340*m*.

Referring back to FIG. 8*b*, the programming of selected cells is as described for an individual cell. The word line 325*a*, . . . , 325*k*, 327*a*, . . . , 327*k* containing the cells to be programmed (multiple cells per word line within each selected unit (byte) may be programmed) is activated to the relatively high voltage (on the order of +10.0V-+12.0V). The gate line 320 and thus the gate of the gating transistors memory cells 100 of the unit of cells 300a, ..., 300k, 305a, ..., 305k to be programmed are set to very high voltage (on the order of +18.0V-+22.0V) to activate the gating transistors gating transistors memory cells 100 of the unit of cells 300a, ..., 300k, 305a, ..., 305k. The bit lines 345a, ..., 345m, 350a, ..., 350m of the column containing the selected nonvolatile memory cells 100 are set to a moderately high voltage (on the order of 6.0V). The master source lines 340a, ..., 340m is set to the ground reference voltage (0V). As described above this causes a channel hot electron charging of the floating gate of the selected nonvolatile memory cells 100.

The bit lines 345a, ..., 345m, 350a, ..., 350m not containing the selected nonvolatile memory cells that are not programmed (these cells are to be set to a logical one (1) by the erasure) are set to the ground reference potential. The select gating lines 320a, ..., 320k are set to the very high voltage level (+15.0V-+22.0V) to activate the select gating lines 320a, ..., 320k for even those bit lines 355a, ..., 355m, 360a, ..., 360m not containing the selected nonvolatile memory cells 100. Thus the drain of the nonselected memory cells not on the bit lines 355a, ..., 355m, 360a, ..., 360m not containing the selected nonvolatile memory cells are set to the ground reference potential (0V).

The nonselected nonvolatile memory cells on the word line 325a, ..., 325k, 327a, ..., 327k containing the selected nonvolatile memory cells have their control gates set to the relatively high voltage (+10.0V-+12.0V). The source of each of the nonvolatile memory cells of the block either selected or nonselected are set to the ground reference potential (0V).

The nonselected nonvolatile memory bit on the bit lines 345a, ..., 345m, 350a, ..., 350m containing the selected nonvolatile have their drains set to the relatively high voltage (+6.0V). Since the drains and the source of the transistor having the floating gate are set to the ground reference potential (0V), the channel hot electron phenomena is prevented from occurring and thus disturbing the nonselected nonvolatile memory cells 100.

Those nonvolatile memory cells not in unit of cells 300a, ..., 300k, 305a, ..., 305k being selected do not have their select gating lines 320a, ..., 320k, word lines 325a, ..., 325k, 327a, ..., 327k, source lines 330a, ..., 330k, ..., 332a, ..., 332k, and bit lines 355a, ..., 355m, 360a, ..., 360m set to the ground reference potential (0V) to prevent any disturbing signals within the nonselected units 300a, ..., 300k, 305a, ..., 305k.

The erasure occurs for an entire unit 300a, ..., 300k, 305a, ..., 305k of memory cells 100 or groups of units 300a, ..., 300k, 305a, ..., 305k of memory cells 100 and is essentially as described for an individual cell. The word line 325a, ..., 325k, 327a, ..., 327k within a selected unit (or units) 300a, ..., 300k, 305a, ..., 305k of memory cells 100 are set to the very large negative voltage (on the order of −15.0V−−22.0V). The select gating lines 320a, ..., 320k of the selected unit 300a, ..., 300k, 305a, ..., 305k and thus the gate of the gating transistors 310a, ..., 310m, 315a, ..., 315m are set to the ground reference potential (0V) to deactivate the gating transistors 310a, ..., 310m, 315a, ..., 315m. The bit lines 345a, ..., 345m, 350a, ..., 350m of the selected unit 300a, ..., 300k, 305a, ..., 305k are set to the ground reference voltage (0V). The master source lines 340a, ..., 340m and thus the source line 330a, ..., 330k, 332a, ..., 332k of the selected unit 300a, ..., 300k, 305a, ..., 305k are set to the ground reference voltage (0V). As described above this causes a Fowler-Nordheim tunneling of charges from the floating gate to remove all charge from the floating gates of the nonvolatile memory cells 100 of the selected unit 300a, ..., 300k, 305a, ..., 305k.

Since all the nonvolatile memory cells 100 of a selected unit 300a, ..., 300k, 305a, ..., 305k of memory cells, those nonvolatile memory cells not in the same unit 300a, ..., 300k, 305a, ..., 305k of nonvolatile memory cells 100 being selected have their select gating lines 320a, ..., 320k, word lines 325a, ..., 325k, 327a, ..., 327k, and bit line 345a, ..., 345m, 350a, ..., 350m set to the ground reference potential (0V) to prevent any disturbing signals within the subarrays.

Figure 7:
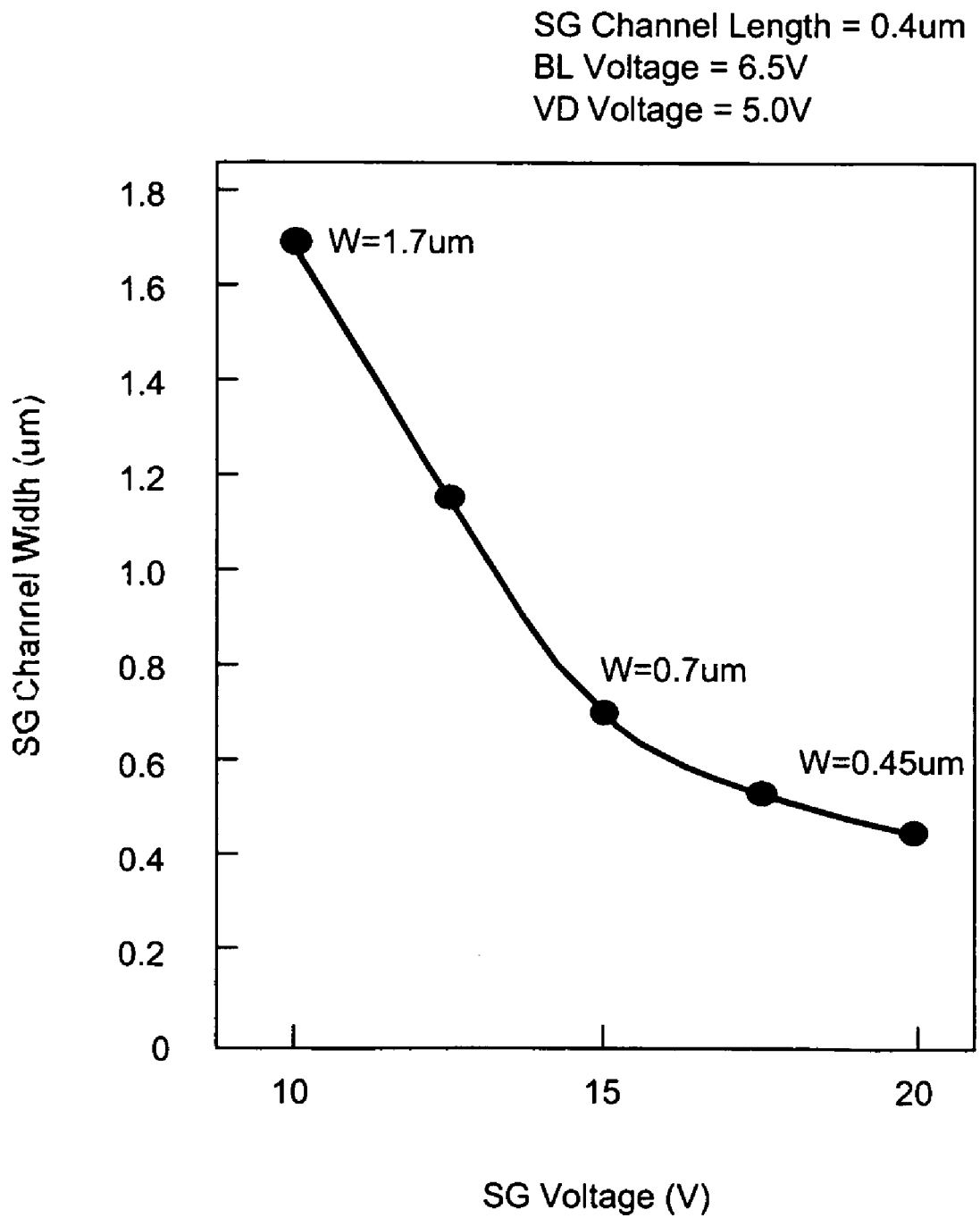
FIG. 7 is a plot of channel width versus select gating signal voltage for the select gating transistor of a two transistor nonvolatile memory cell of this invention.

FIG. 7 is a plot that illustrates the relationship between the select gating transistor's gate voltage for the gating transistors 210a, ..., 210m, 215a, ..., 215m of FIG. 4 or the select gating transistor 130 of each two transistor nonvolatile memory cell of FIGS. 5a-5c. The bit line voltage generator of a charge pump circuit of a memory array sets the bit line to a voltage of approximately 6.5V. This is on the assumption that the memory cell requires a drain voltage 5V and drain current 500 µA to perform channel hot electron programming. The select gating transistor is designed to have a channel length is fixed at 0.4 µm. The plot illustrates the minimum channel width required to provide this required condition under different gate voltages. It is shown that the channel width must be 1.7 µm for the nonvolatile memory cells of the prior art where the control gate is set to a voltage 10V. However, for the control gate voltage of a memory cell of this invention, the voltage applied is increased to 20V. This allows the select gating transistor's channel width can be drastically reduced to only 0.45 µm. This allows the select gating transistor to have a sufficiently small size to fit into the memory cell's pitch (width of a column of memory cells in an array. The two transistor nonvolatile memory cell constructed within an EEPROM array contains identical memory cell structure as the one transistor nonvolatile memory cell constructed in Flash memory array of this invention. Both array structures use the identical Fowler Nordheim channel erase and Channel Hot Electron program schemes. This allows for the integration of EEPROM array structures and the flash memory array structures within the same integrated circuit on a substrate.

Figure 9A:
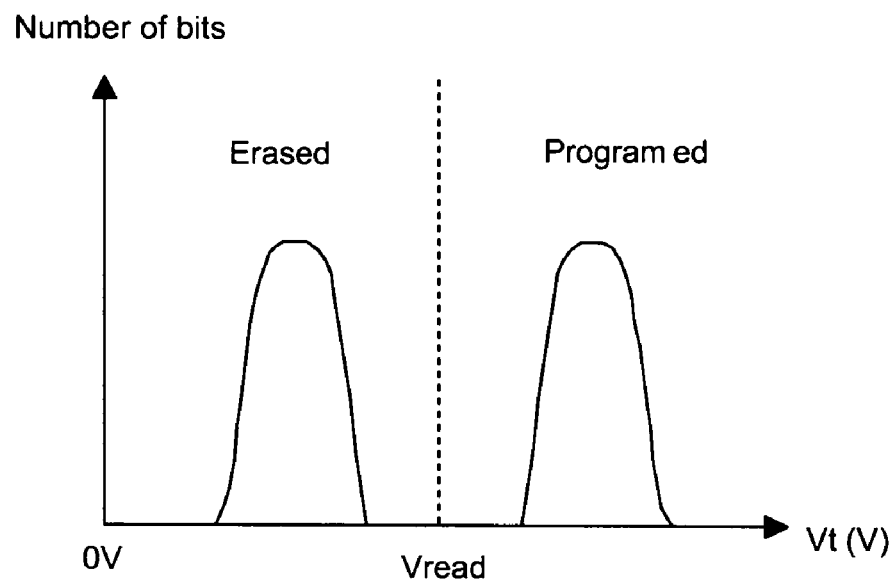
FIGS. 9a and 9b are plots showing the distribution of the threshold voltages of nonvolatile memory cells of this invention for programming and erasure.
Figure 9B:
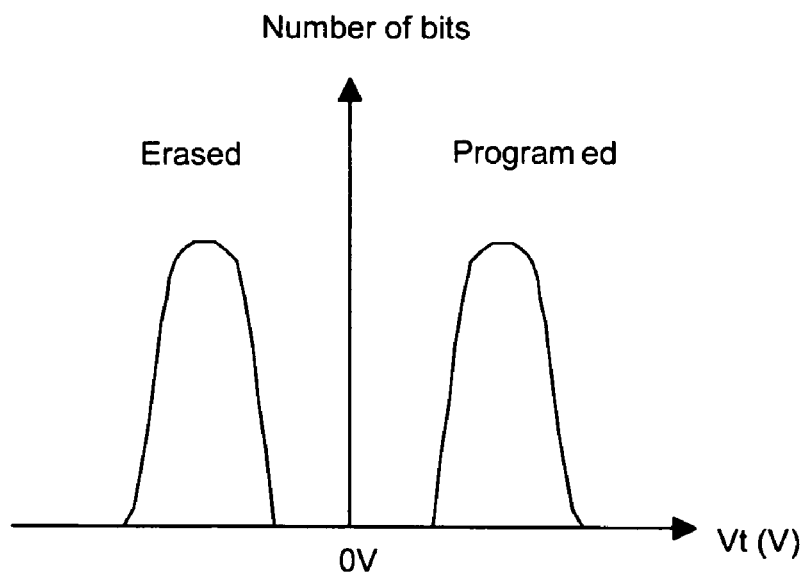

FIGS. 9a and 9b illustrates the distribution of the voltage threshold groups of nonvolatile memory cells of this invention. The voltage that is used as the reference threshold voltage during a read operation (Vread) is defined as the demarcation between the erased (logical 1) and the programmed (logical 0) for the nonvolatile memory cells. Since the amount of charge that is removed from the floating gate during erasure or placed on the floating gate during programming varies, the voltage threshold for the nonvolatile memory cells has a distribution as shown. The bit lines containing the selected nonvolatile memory cells of an array are set to a voltage sufficient to detect whether the selected nonvolatile memory cells is programmed or erased and the word line containing the selected nonvolatile memory cell is placed at the reference threshold value (Vread). If the selected nonvolatile memory cell is erased, the selected nonvolatile memory cell is turned on and the logical 1 is detected. Alternately, if the selected nonvolatile memory cell is programmed, the selected nonvolatile memory cell is not turned on and the logical 0 is detected.

As described above, those nonvolatile memory cells that have not been programmed (erased) and are then subjected to a repeated erase operation may become over-erased as shown in FIG. 9b. Conversely, those nonvolatile memory cells in a block of nonvolatile memory cells having a faster erase speed may also be subject to over-erasure. The floating gate transistor of the nonvolatile memory cell is essentially operating in the enhancement mode and conducts (turned on) at all times. This condition can not be tolerated for the one transistor Flash nonvolatile memory cell of FIGS. 3a-3d. However, the two transistor EEPROM nonvolatile memory cell of FIGS. 5a-5d tolerates the over-erased cell and prevents corruption of data in other cells by preventing of the flow of current in the bit lines through the enhanced floating gate transistor. A special operation called 'correction, 'repair', 'recover', 'converge', or 'soft-programming' may be adopted to adjust the threshold voltage of those over-erased nonvolatile memory cells back to be centered on the desired reference threshold voltage (Vread) for Flash cell.

Figure 10:
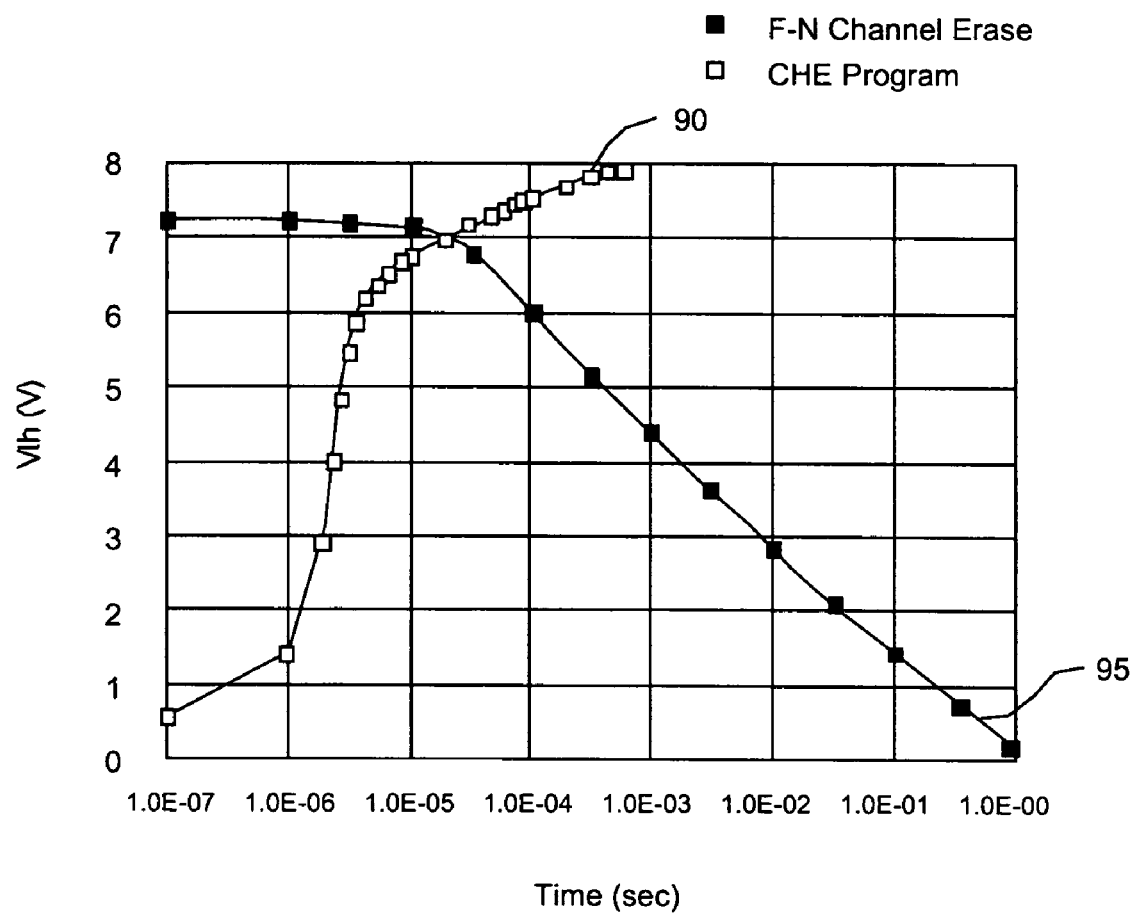
FIG. 10 is a plot of threshold voltage versus time for nonvolatile memory cell of this invention for determining duration of the program and erase operation for the nonvolatile memory cell of this invention.

Since the single transistor Flash nonvolatile memory cell and the two transistor EEPROM nonvolatile memory cell of this invention utilize the same structure for applications as the EEPROM and the flash memory, the amount of time for programming and erasure can be identical. In practice, Flash erase time is around few hundred mS, while EEPROM is few mS in product spec. Both memory uses same scheme of CHE for programming, thus the program time are identical from 1 µs to 100 µs range in today's product spec. Refer now to FIG. 10 for a discussion of the program and erase times for the nonvolatile memory cell of this invention. The amount of time to change the threshold voltage with channel hot electron programming is shown in the plot 90. While the amount of time for removal of the charges from the floating gate with Fowler Nordheim tunneling to erase the nonvolatile memory cell is shown in plot 95. The time for the application of the necessary voltages as described for the programming of the nonvolatile memory cell has a duration of from approximately 1 µs to approximately 10 µs. The erasure of the nonvolatile memory cell has a duration of from approximately 1 ms to approximately 1 s.

Refer now to FIGS. 11a-11m for a discussion of the method for fabrication of the nonvolatile memory cell 100 and the gating transistors 210a, . . . , 210m, 215a, . . . , 215m of the flash memory structure of FIG. 4 or the gating transistor 130 of the two transistor nonvolatile memory cell of FIGS. 5a-5c. In this illustration, the floating gate transistor 100 and the select gating transistor 130 have a stack gate structure comprising of two polycrystalline silicon layers (poly-1 and poly-2) but only the control gate 116 and floating-gate 112 of cell 100 is separated by the inter-poly dielectric 114. The poly-2 control gate and poly-1 floating gate of select gating device 130 is shorted without separation. For the floating gate transistor 100, the poly-1 is used as the floating gate, and the poly-2 is used as the control gate. The select gate transistor 130 has also a stack gate structure, but the gate voltage is directly applied to the poly-1 layer.

Figure 11A:
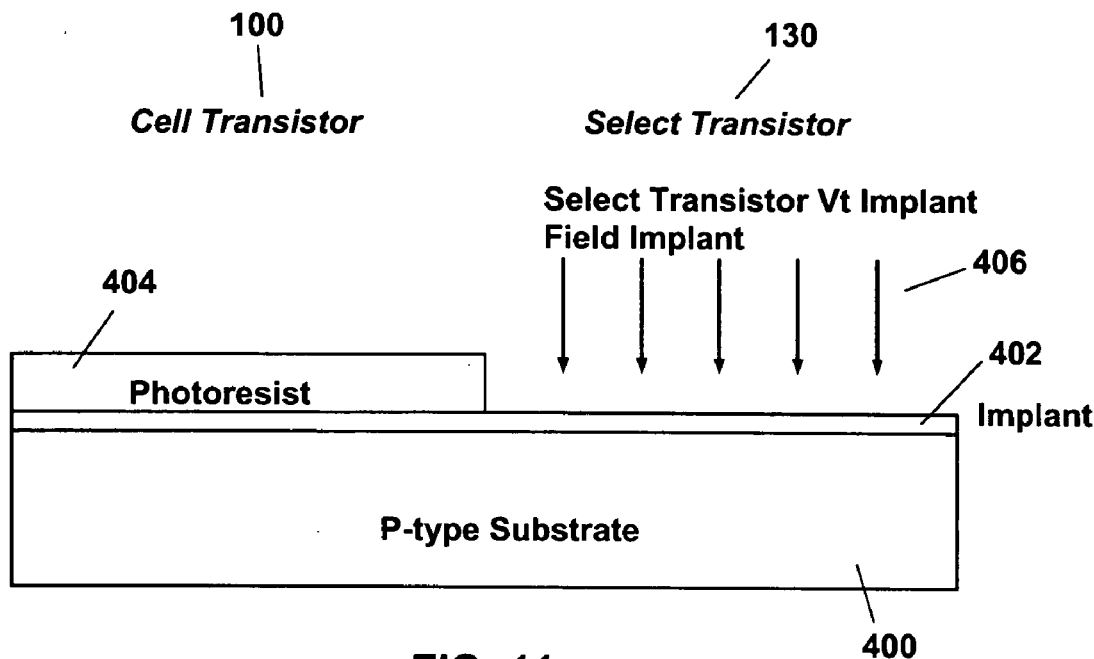
FIGS. 11a-11m are cross sectional diagrams of a substrate illustrating the steps for the formation of the one transistor nonvolatile memory cell of this invention.

Referring FIG. 11a, in which a p-type silicon substrate 400 with <100> crystallographic orientation is provided. An implant oxide 402 is next formed on the silicon substrate 400 by thermal oxidation or deposition with a thickness between about 100 Å to 300 Å. A layer of photoresist 404 is then deposited and patterned by the mask of select gate transistor 130 area. The select gate transistor 130 area is then implanted 406 with a threshold voltage adjustment (Vt) implant followed by a field implant. Both implants use a p-type impurity such as boron or boron difluoride ($BF_2$) to adjust the threshold voltage of select gate transistor 130 and the field transistor turn-on voltage. The threshold voltage of the select gate transistor 130 is between about 0.6 to 1.5 V, and the threshold voltage of the field transistor is generally larger than 18 V. The select gate transistor 130 Vt implant has energy between about 5 to 50 KeV and a dose between about 3E11 to 5E12 ions/$cm^2$ using boron ions. The field implant 406 for the select gate transistor 130 has an implant energy between about 30 to 180 KeV and a dose between about 1E12 to 1E14 ions/$cm^2$ using boron ions. The field implant has higher implant energy than the select gate transistor 130 Vt implant because the implanted ions need to penetrate the field oxide. During program, the select gate voltage is between about 14 to 20 V, which is higher than word line voltage. The field implant is therefore required to increase the threshold voltage of the field transistor to insure the field transistor is not turned on when select gate has a high voltage.

Figure 11B:
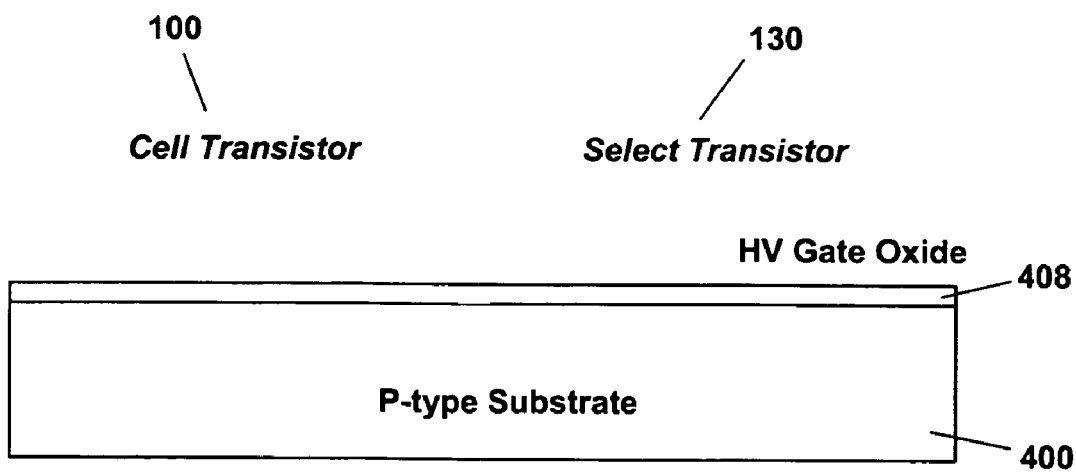
Figure 11C:
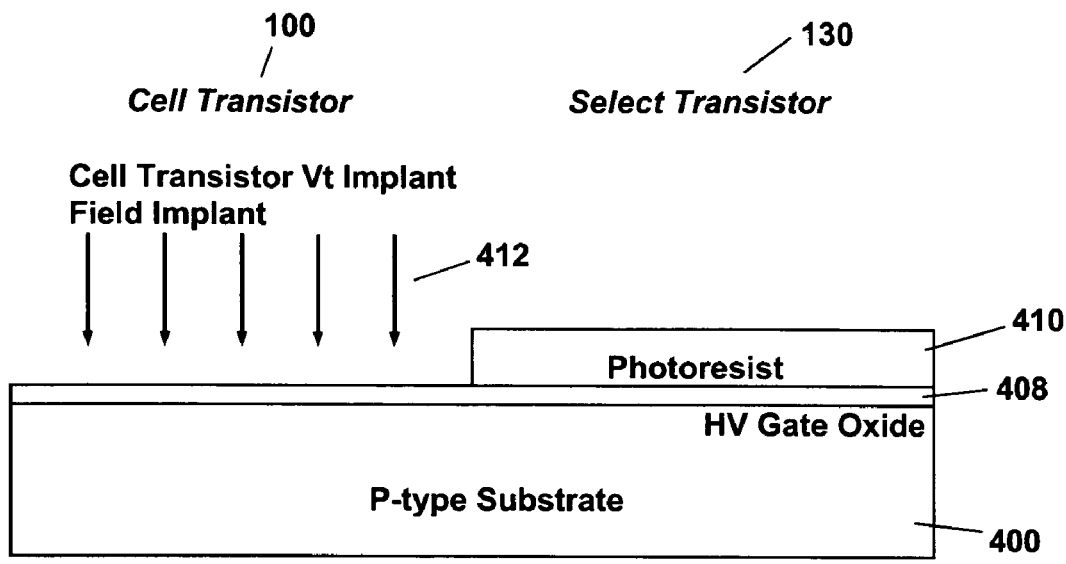

After the photoresist 404 and the implant oxide 402 are stripped, a layer of high voltage (HV) gate oxide 408 of a thickness between about 100 to 300 Å is then thermally grown on the silicon substrate 400 as shown in FIG. 11b. The silicon substrate 400 is then patterned by the cell transistor photolithography to form the photoresist 410. The floating gate transistor 100 area is implanted 412 with nonvolatile memory cell transistor 100 Vt implant and field implant. The cell Vt implant is used to adjust the threshold voltage of the nonvolatile memory cell transistor 100, which is between about 1.0 to 3.0 V. The field implant is to increase the threshold voltage of the N-field transistor not shown in drawing to higher than 20.0 V. The nonvolatile memory cell transistor 100 Vt implant has energy between about 5 to 50 KeV and a dose between about 1E12 to 1E13 ions/$cm^2$ using boron ions. The field implant has energy between about 30 to 180 KeV and a dose between about 1E12 to 1E14 ions/$cm^2$ using boron ions.

Figure 11D:
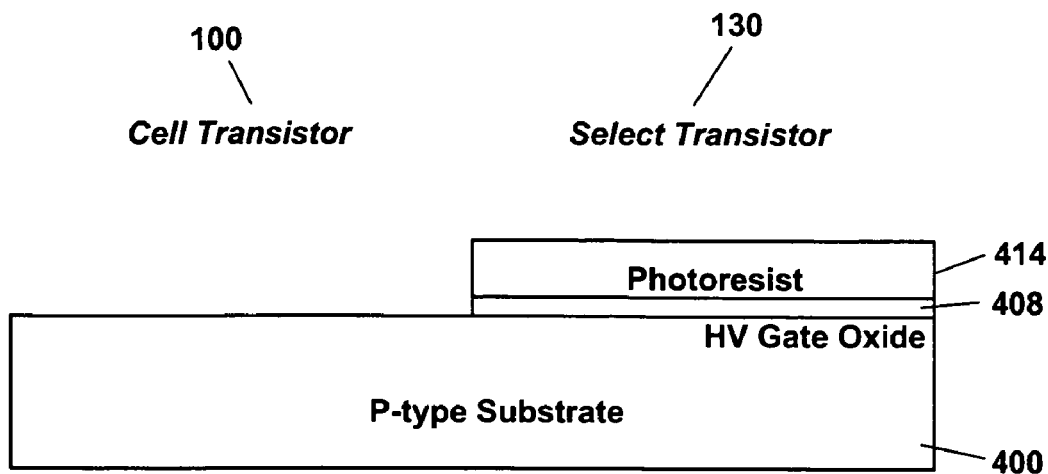
Figure 11E:
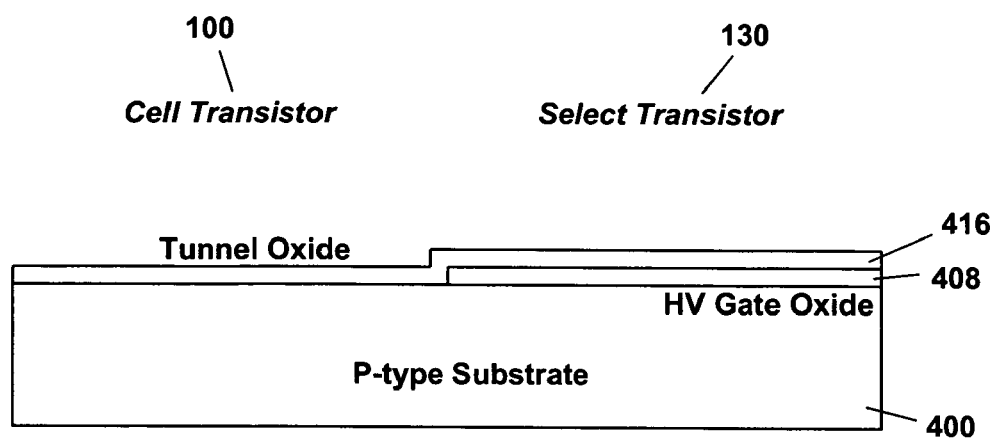

The HV gate oxide 408 is then removed in the nonvolatile memory cell transistor 100 area as shown in FIG. 11d. The photoresist 414 is then removed. The tunnel oxide 416 of a thickness between about 70 to 120 Å is then thermally grown on the silicon wafer by the conventional dry oxidation process at a temperature between about 900 to 1100° C. as shown in FIG. 11e. The tunnel oxide 416 grown on the select gate transistor 130 area is thinner than the oxide grown on the nonvolatile memory cell transistor 100 area, because the HV gate oxide 408 already exists on that area. The tunnel oxide 416 and HV gate oxide 408 are combined to be the gate oxide for the select gate transistor 130, which is between about 150 to 350 Å.

Figure 11F:
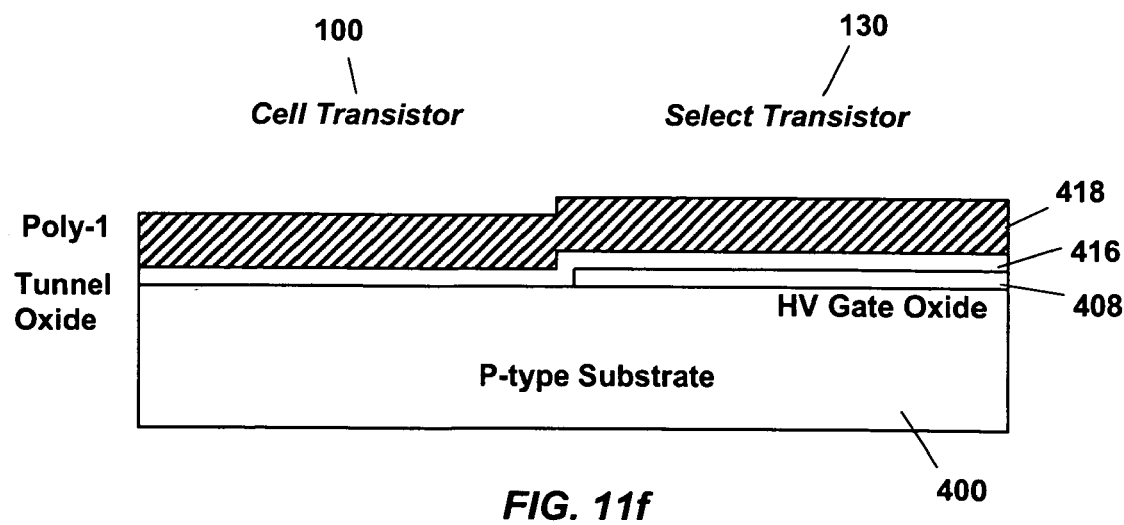

Referring to FIG. 11f, the first polysilicon layer (Poly 1) 418 is then deposited, using LPCVD procedures, at a thickness between about 1000 to 2000 Å. The polysilicon layer 418 is then patterned by the poly-1 photo. The polysilicon layer 418 in the poly-1 window area is removed.

Figure 11G:
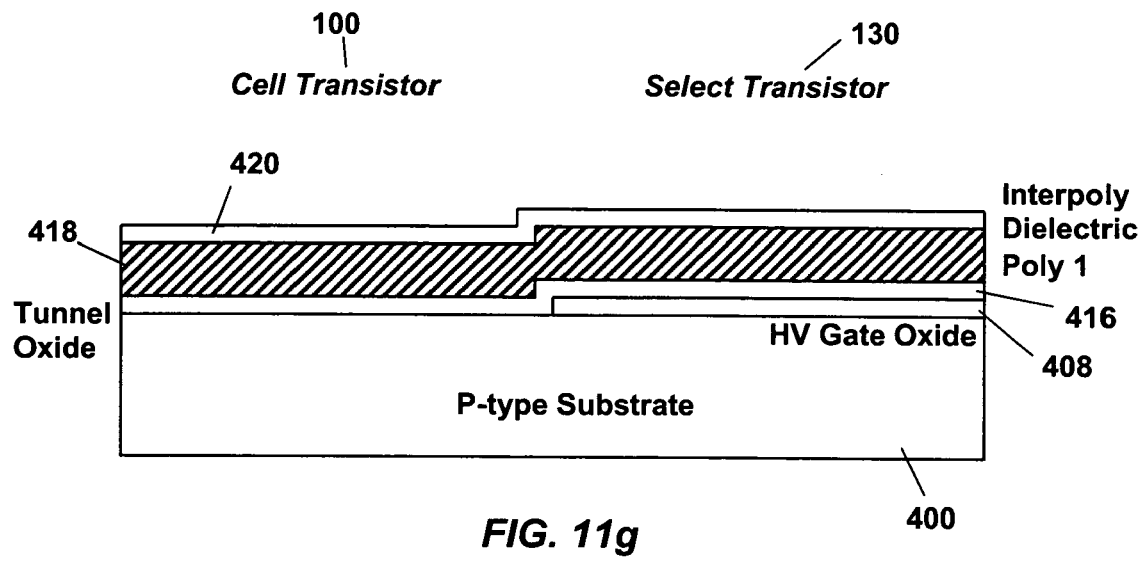
Figure 11H:
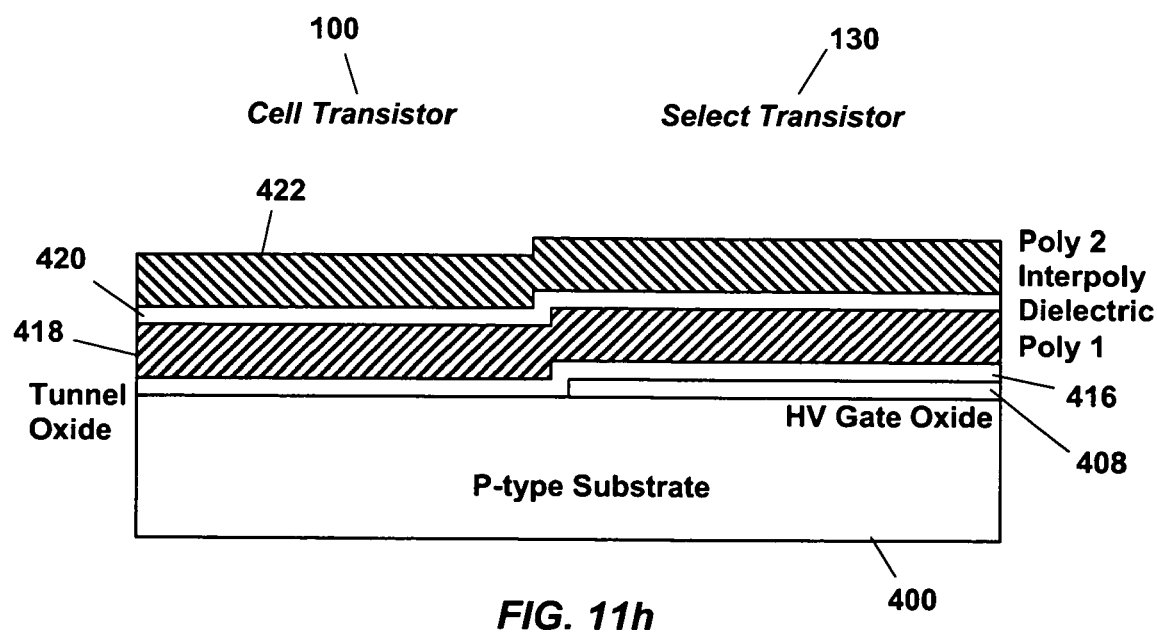

An inter-polysilicon dielectric layer 420, such as silicon dioxide, silicon nitride, or oxide/nitride/oxide composite layer, is next deposited using low pressure chemical vapor deposition (LPCVD), Plasma Enhanced Chemical Vapor Deposition (PECVD), or high density plasma chemical vapor deposition (HDPCVD), or thermal oxidation procedures can also be used to create the silicon oxide option, all resulting in a thickness between about 100 to 300 Å as shown in FIG. 11g. A deposition of a second polysilicon layer 422 follows, using LPCVD procedures, at a thickness between about 1500 to 3000 Å, again in situ doped, during deposition, via the addition of arsine, phosphine, to a silane ambient, or add a layer of Tungsten Silicide (WSi) to be used subsequently for the control gate of the nonvolatile memory cell 100 as shown in FIG. 11h.

Figure 11I:
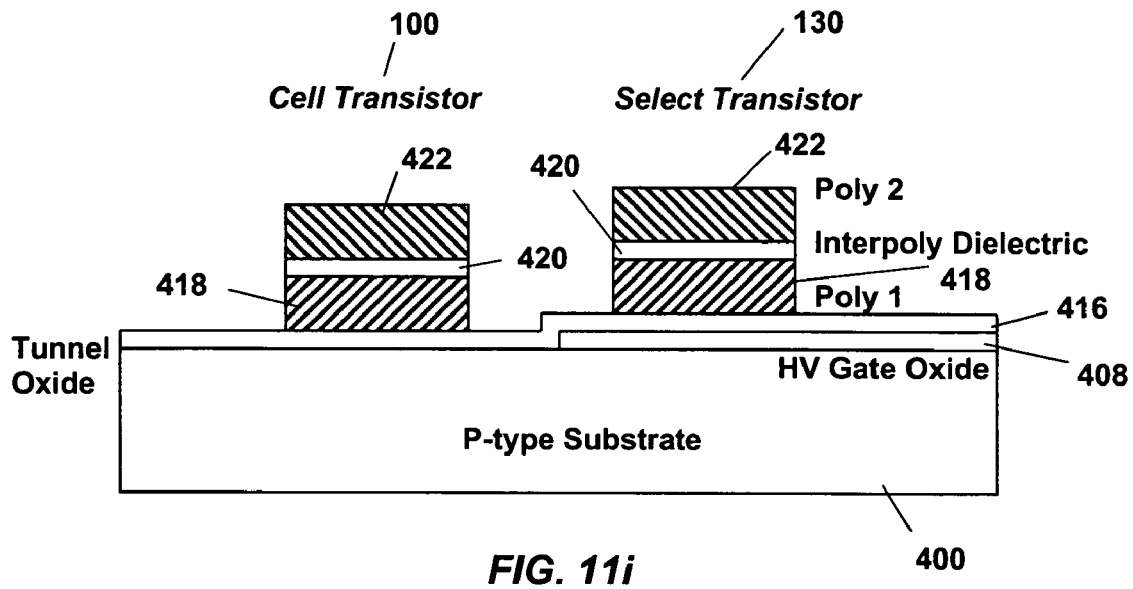

Photolithographic and reactive ion etching (RIE) procedures are next employed to create stacked gate structure with the poly 1 418 and the poly 2 422 layer, schematically shown in cross sectional representation in FIG. 11i. The anisotropic RIE procedure is performed using chlorine ($Cl_2$) for second polysilicon layer 422, and for first polysilicon layer 418, while a fluorine containing gas $CHF_3$ is used to pattern inter-polysilicon dielectric layer 420. The stacked gate structure of the nonvolatile memory cell 100 has the control gate formed of the second polysilicon layer 422, inter-polysilicon dielectric layer 420, and floating gate formed of the first polysilicon layer 418. The stacked gate structure as described resides on tunnel oxide layer 416.

Figure 11J:
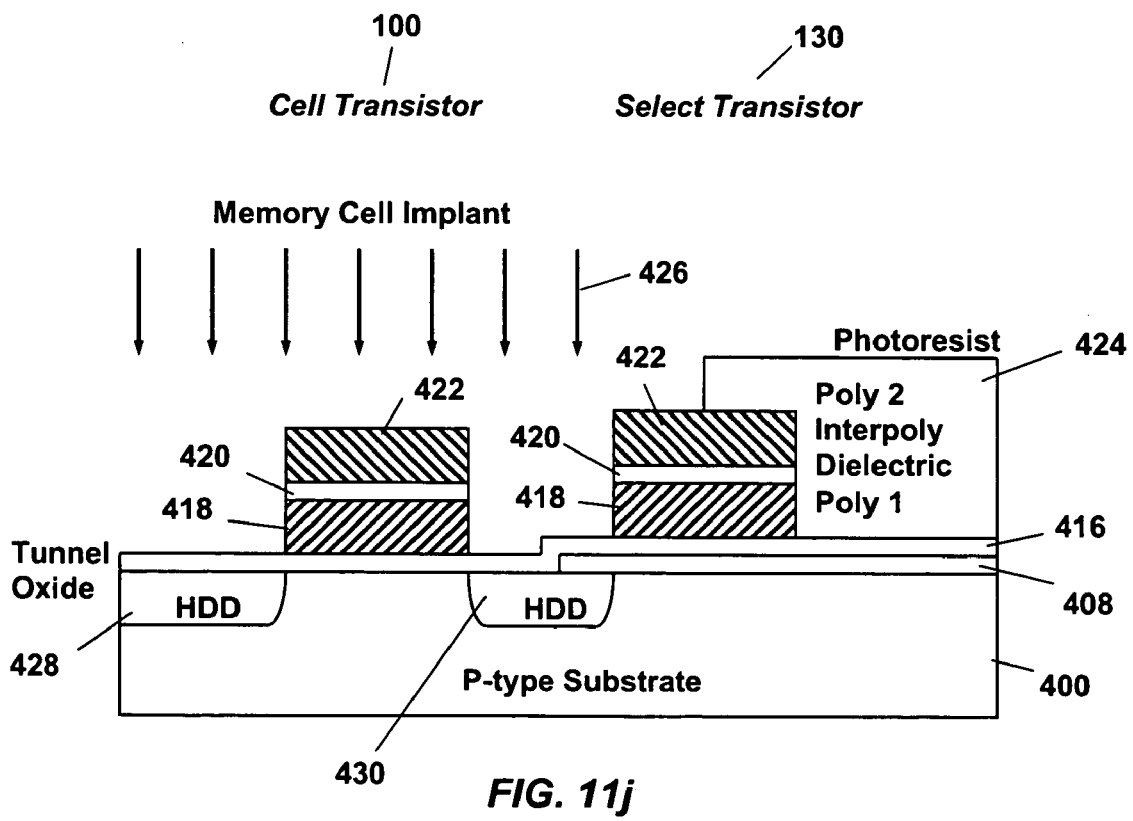

Referring to FIG. 11j, a layer of photoresist 424 is deposited. The memory cell photo mask defines the nonvolatile memory cell 100 area, from which the photoresist is removed. The nonvolatile memory cell source 428 and drain 430 junctions are next formed via an ion implantation 426 procedure, at an energy about 30 to 60 KeV, and at a dose between about 1E15 to 7E15 ions/$cm^2$, using arsenic ions. The nonvolatile memory cell drain 430 junction is an abrupt junction to promote impact ionization of channel hot electrons. The memory cell implant 426 is to create a heavily doped drain (HDD) junction for the cell drain. Further the nonvolatile memory cell source 428 and drain 430 are structured to align with edges of the stacked gate structure of the floating gate and the control gate of the nonvolatile memory cell 100. As noted in FIG. 3d, the stacked gate structure is constrained within the shallow trench isolation (not shown) that demarcates the boundary of the nonvolatile memory cell.

Figure 11K:
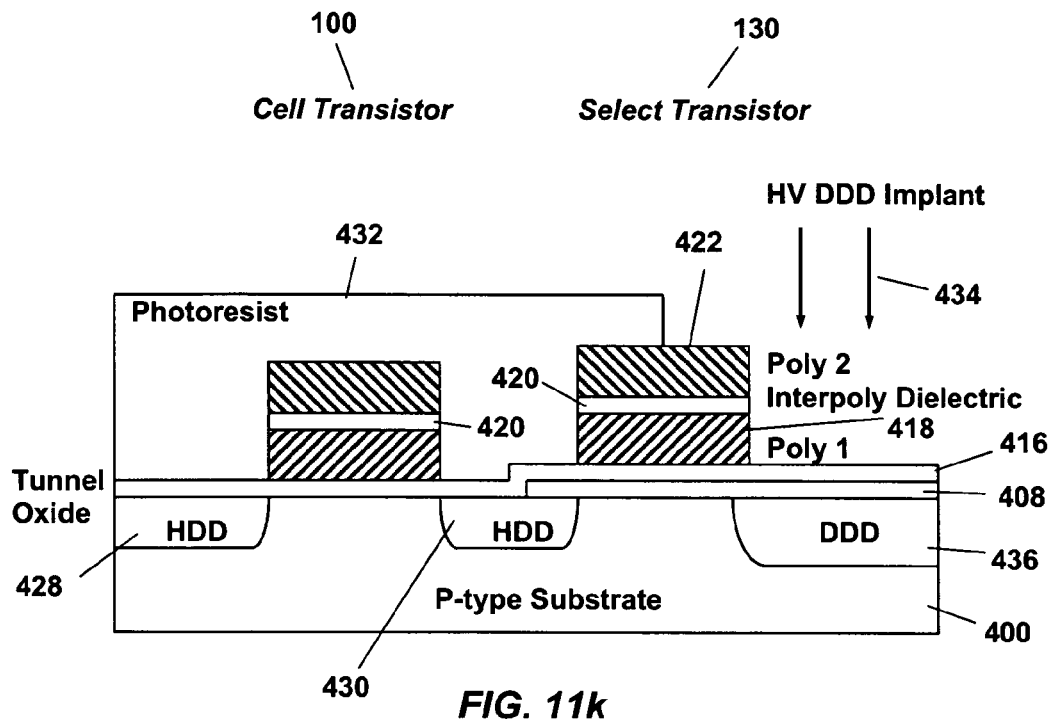

The drain junction 436 of the select gate transistor 130, shown in FIG. 11k requires sustaining a higher junction breakdown voltage than the nonvolatile memory cell drain 430 junction. The impact ionization near the drain junction 430 of the select gate transistor 130, on the other hand, is not desired. The drain junction 436 of the select gate transistor 130 has a different doping profile from the nonvolatile memory cell drain 430 junction. The select gate transistor drain 436 region is defined by the select gate transistor 130 photo mask 432, and implanted 434 with phosphorus ions at an energy about 50 to 150 KeV, and at a dose between about 1E14 to 2E15 ions/$cm^2$. The implant 434 is to create a double diffused drain (DDD) junction 436 for the select gate transistor 130 drain. The DDD junction 436 has a more gradual doping profile than the memory cell drain 430 junction.

Figure 11L:
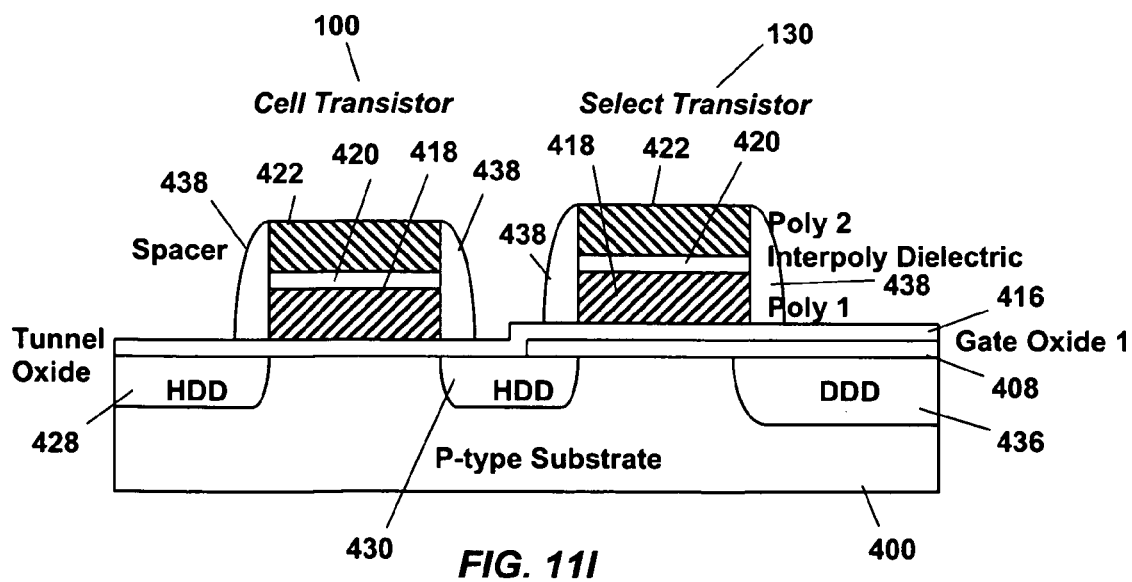
Figure 11M:
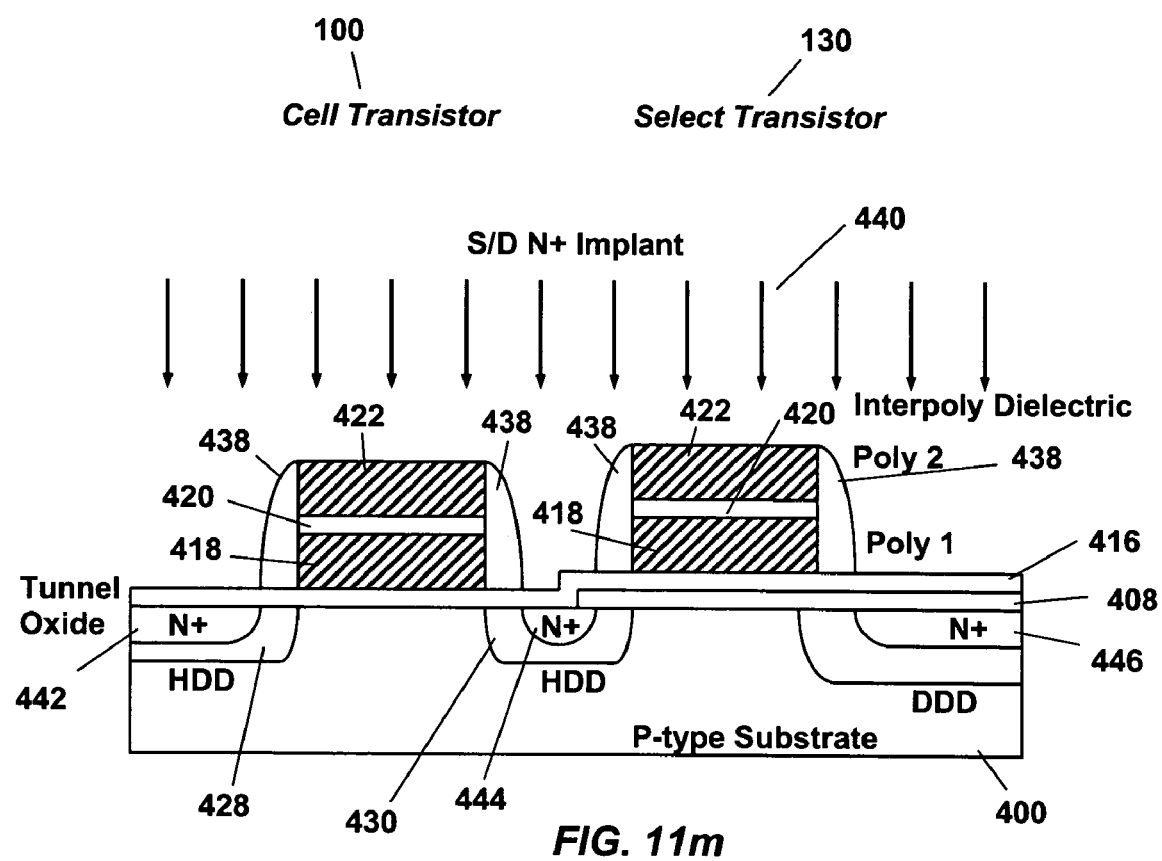
Figure 12A:
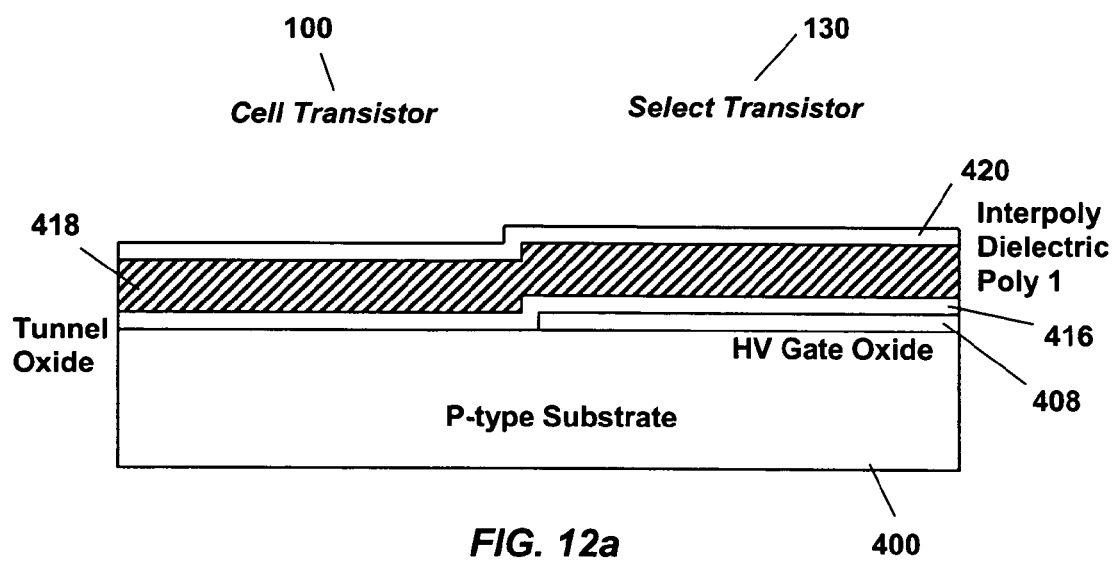
FIGS. 12a-12c are cross sectional diagrams of a substrate illustrating the additional steps for the formation of the two transistor nonvolatile memory cell of this invention.
Figure 12B:
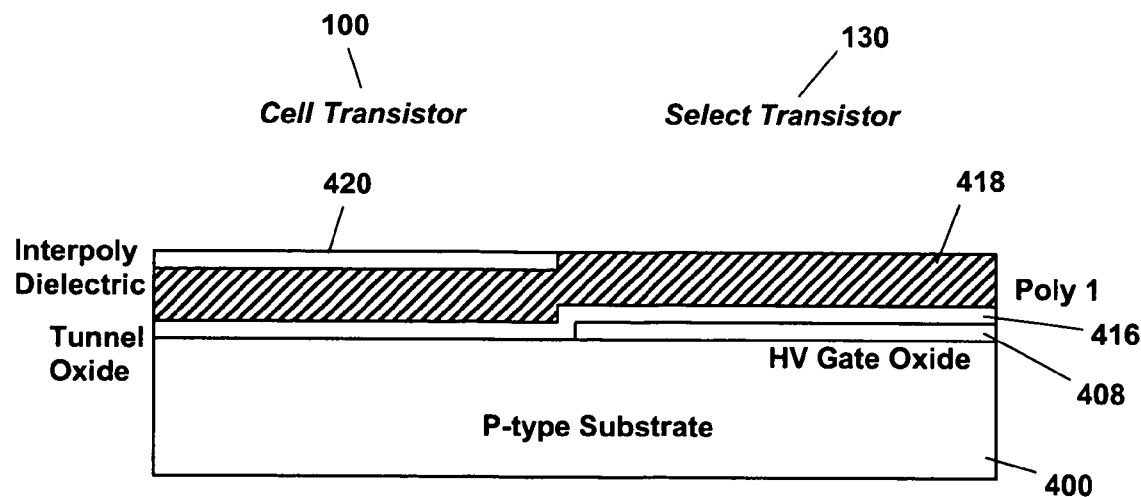
Figure 12C:
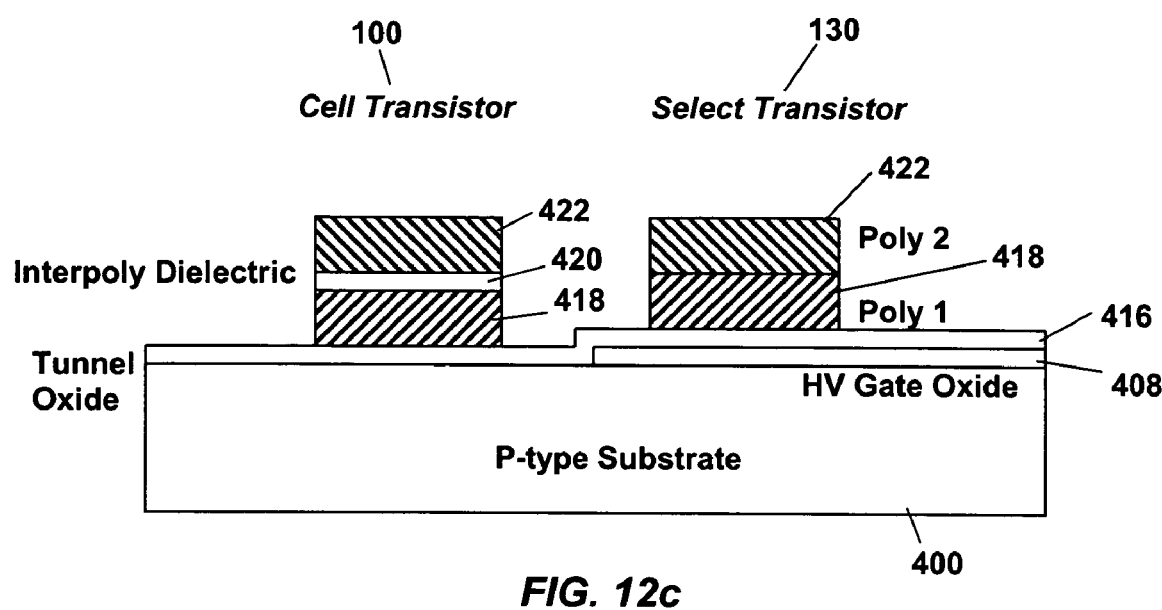

Insulator spacers 438, schematically shown in FIG. 11l, are formed via deposition of an insulator layer, such as silicon nitride, via LPCVD or PECVD procedures, at a thickness between about 1000 to 2000 Å, followed by an anisotropic RIE procedure, using a fluorine based compound ($CF_4$) as an etchant. Source/drain n+ implant 440 is then implanted via an ion implantation procedure, at an energy between about 30 to 60 KeV, at a dose between about 5E14 to 1E16 ions/$cm^2$ using arsenic or phosphorus ions to reduce the source/drain(442, 444, 446) series resistance.

The process is continued by depositing interlevel dielectric (ILD) layer, comprised of silicon dioxide, obtained via LPCVD or PECVD procedures, at a thickness between about 8000 to 15,000 Å. The ILD completely fills the spaces between stacked gate structures. Planarization of ILD layer is then accomplished via a chemical mechanical planarization (CMP) procedure, resulting in a smooth top surface topology for ILD layer, reducing the severity of the subsequent, photolithographic procedure, used for the openings to the source/drain regions. The contact hole opening is created via a RIE procedure of the ILD layer, using a fluorine based etchant such as $CHF_3$. A metal layer such as tungsten, at a thickness between about 3000 to 4000 Å, is deposited via LPCVD procedures, using tungsten hexafluoride as a source, or via RF sputtering procedures, completely filling the contact hole opening. Removal of the tungsten layer, residing on the top surface of ILD layer, is accomplished via a CMP procedure, or via a selective RIE procedure, using $Cl_2$ as an etchant. The tungsten plug is to provide the electric contact to the source, drain, and the polysilicon gate. A metal layer, such as an aluminum layer is then deposited, via RF sputtering, to a thickness between about 3000 to 8000 Å to provide the first metal interconnects.

The stacked gate structure (418, 420, and 422) of the select gate transistor has an external connection of the poly 1 gate to the select gating lines 320a, . . . , 320k of FIG. 6. The process steps for the nonvolatile memory cell and the select gating transistor as shown may be implemented by concurrent semiconductor process of any current semiconductor process and will be applicable as advances in process steps become available in the future. The high voltage related reliability issue can be optimized by carefully choosing the parameters of the cell structure such as channel length, gate oxide thickness, shallow trench isolation depth, etc. The present semiconductor processing of a NAND-type-array Flash memory nonvolatile cells has been proven to have very high reliability. The process is able to sustain higher than 20V with more than 1 million cycles endurance, which is sufficient to manufacture the nonvolatile memory cell of this invention.

A variation of the fabrication process is described as follows in FIGS. 14a-14c. This variation is a self-aligned process, in which the first polysilicon is self-aligned to the field oxide in order to reduce the width of the nonvolatile cell size to the width of the source and drain of the nonvolatile memory cell 100 as shown in FIG. 3d. The shallow trench isolation 126 of FIG. 3d is formed after the first polysilicon 418 deposition so that the first polysilicon 418 is self-aligned to the active edge of the nonvolatile memory cell 100 of FIG. 14a.

The deposition and formation of the first polysilicon layer 418 can be made by the well-known process such as Low Pressure CVD or LPCVD resulting in a layer of approximately 500-650 Å thickness of polysilicon on the tunnel-oxide as described above. A silicon nitride layer of preferably 1500 Å is deposited by CVD. The photo mask of active area is used to define the active regions during isolation formation. A layer of photoresist is applied on the silicon nitride layer and a masking step is performed to etch the silicon nitride, the first polysil, and the underlying insulating layer in the selective regions. Where the photoresist is not removed, they remain on top of the silicon nitride, the first polysilicon region, and the underlying insulating material region. Where the photoresist is removed, the silicon nitride, the polysilicon, and the underlying insulating material are etched away. There are two methods for the formation of the isolation regions: Local oxidation of silicon (LOCOS) and shallow trench isolation. In the shallow trench isolation method, the etching continues into the substrate to a depth of approximately 2800 Å~3200 Å. The silicon trenches are filled with an isolation material such as silicon dioxide. This can be the well-known LOCOS process resulting in the local field oxide or it can be shallow trench isolation (STI) process resulting in the silicon dioxide being formed in the region. In the preferred method, the shallow trench will be formed. Shallow trench isolation is desirable because it can be formed planar with respect to the first polysilicon layer 418. The structure the floating gate 418 of the nonvolatile memory cell 100 is self-aligned to the source and drain of the nonvolatile memory cell 100.

After the isolation region is formed, an inter-polysilicon dielectric layer 420, such as silicon dioxide, silicon nitride, or oxide/nitride/oxide composite layer, is next deposited using LPCVD, PECVD, or high density plasma chemical vapor deposition (HDPCVD), or thermal oxidation procedures can also be used to create the silicon oxide option, all resulting in a thickness between about 100 to 300 Å as shown in FIG. 14a. The inter-polysilicon dielectric layer 420 is then patterned by the photo mask of oxide-nitride-oxide (ONO). The inter-polysilicon dielectric layer 420 is removed in the select gate transistor 130 area as shown in FIG. 14b by the anisotropic RIE procedure using fluorine compounds ($CHF_x$). A second polysilicon layer 422 is deposited as described in FIG. 11h, using LPCVD procedures, at a thickness between about 1500 to 3000 Å, again in situ doped, during deposition, via the addition of arsine, phosphine, to a silane ambient, or to add a layer of WSi to be used subsequently for the control gate of the nonvolatile memory cell.

Photolithographic and RIE procedures are next employed to create stacked gate structure (418, 420, and 422) schematically shown in cross sectional representation, in FIG. 14c. The second polysilicon layer 422 is deposited such that it is direct electrical contact with the first polysilicon layer 418 to form the gate for the select gate transistor 130.

The single and two transistor nonvolatile memory cell allow for a scalable memory array that may be used for either a flash memory or for an EEPROM employing the same nonvolatile cell structure. This enables the combination of the flash memory and the EEPROM as discrete memory or embedded memory within an integrated circuit. The single and two transistor nonvolatile memory cells as used in a flash memory and an EEPROM use an identical nonvolatile memory manufacture technology and erase scheme, thus having equivalent performance. The nonvolatile memory cell of this invention permits a small die size, superior endurance cycle, and high flexibility.

While this invention has been particularly shown and described with reference to the preferred embodiments thereof, it will be understood by those skilled in the art that various changes in form and details may be made without departing from the spirit and scope of the invention.

The invention claimed is:

1. A nonvolatile memory cell formed on a substrate comprising:
   a floating gate placed over a channel region of said memory cell and between a source and a drain region of said memory cell, said floating gate aligned with an edge of said source region and an edge of said drain region and having a width constrained by a width of said edge of said source and said edge of said drain to prevent said floating gate from having wings overlapping a shallow trench isolation region bounding said nonvolatile memory cell; and
   a gating transistor having a source connected to said drain region, a drain, and a gate connected to a select gate signal to selectively apply a bit line voltage signal to the drain region;
   wherein said memory cell has a relatively small coupling ratio of capacitance formed by a control gate placed over said floating gate to a total capacitance of said floating gate and said control gate, wherein said coupling ratio is less than 50%, and
   wherein said memory cell is in communication with an erasing apparatus to remove electrical charge from said floating gate, said erasing apparatus comprising:
   means for applying a very large negative voltage from approximately −15V to approximately −22V to said control gate,
   wherein said erasing apparatus has a duration from approximately 1 ms to approximately 1 s.

2. The nonvolatile memory cell of claim 1, wherein said erasing apparatus further comprises:
   means for disconnecting the source region and the drain region of said memory cell to allow said source region and said drain region to float.

3. The nonvolatile memory cell of claim 1, wherein said erasing apparatus further comprises:
   means for applying a ground reference voltage to said source and said drain region of said memory cell.

4. The nonvolatile memory cell of claim 1 wherein said erasing apparatus further comprises:
   means for applying a ground reference voltage to said select gate.

5. The nonvolatile memory cell of claim 1 wherein said erasing apparatus further comprises:
   means for disconnecting the source region and the drain region to allow said source region and said drain region to float.

6. The nonvolatile memory cell of claim 1, wherein said erasing apparatus further comprises:
   means for applying a ground reference voltage to said source region and said drain region of said memory cell.

7. A nonvolatile memory array formed on a substrate comprising:
   a plurality of nonvolatile memory cells arranged in rows and columns, each nonvolatile memory cell comprising:
   a source region placed within a surface of said substrate;
   a drain region placed within the surface of said substrate at a distance from said source region;
   a tunneling insulating layer placed on said surface in a channel region between said source region and said drain region,
   a floating gate placed over said tunneling insulating layer, said floating gate aligned with an edge of said source region and an edge of said drain region and having a width constrained by a width of said edge of said source and said edge of said drain; and
   a control gate placed over said floating gate and isolated from said floating gate by an insulating layer, and
   a gating transistor having a source connected to the drain region, a drain connected to a bit line, and a gate connected to a select gate signal to selectively apply the bit line voltage signal to the drain region;
   a plurality of bit lines, each bit line in communication with the drain region of all nonvolatile memory cells of one column of nonvolatile memory cells;
   a plurality of word lines, each word line connected to the control gates of all nonvolatile memory cells in one row of the nonvolatile memory cells; and
   a shallow trench isolation formed within said substrate to insulate each of said plurality of nonvolatile memory cells, wherein said width of said floating gate of each nonvolatile memory cell of the plurality of nonvolatile memory cells as constrained by said width of said edge of said source and said edge of said drain prevents said floating gate from having wings overlapping said shallow trench isolation region bounding said nonvolatile memory cell; and a plurality of select lines, each select line connected to the gate of the gating transistor of each nonvolatile memory cell of one row of nonvolatile memory cells, wherein each memory cell has a relatively small coupling ratio of capacitance formed by said control gate to a total capacitance of said floating gate and said capacitance of said control gate, wherein said coupling ratio is less than 50%, and wherein a selected memory cell is in communication with an erasing apparatus to remove charge from said floating gate, said erasing apparatus comprising:

means for applying a very large negative voltage from approximately −15V to approximately −22V to the word line connected to said control gate of the selected memory cell, wherein said erasing apparatus has a duration of approximately 1 ms to approximately 1 s.

8. The nonvolatile memory array of claim 7, wherein said erasing apparatus further comprises:

means for disconnecting the source line connected to the source region of the selected memory cell and bit line in communication with the drain region of the selected nonvolatile memory cell to allow said source region and said drain region to float.

9. The nonvolatile memory array of claim 7 wherein said erasing apparatus further comprises:

means for applying a ground reference voltage to the source line connected to the source region of the selected memory cell and bit line in communication with the drain region of the selected nonvolatile memory cell.

10. The nonvolatile memory array of claim 7 wherein said erasing apparatus further comprises:

means for applying a ground reference voltage to said select line connected to the gate of the gating transistor of the selected nonvolatile memory cell.

* * * * *